United States Patent
Kawashima et al.

(10) Patent No.: US 11,217,190 B2
(45) Date of Patent: Jan. 4, 2022

(54) DISPLAY DEVICE INCLUDING PIXELS AND SOURCE DRIVE CIRCUIT

(71) Applicant: SEMICONDUCTOR ENERGY LABORATORY CO., LTD., Atsugi (JP)

(72) Inventors: Susumu Kawashima, Kanagawa (JP); Koji Kusunoki, Kanagawa (JP); Kei Takahashi, Kanagawa (JP); Kouhei Toyotaka, Kanagawa (JP); Kazunori Watanabe, Tokyo (JP); Shigeru Onoya, Kanagawa (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 0 days.

(21) Appl. No.: 16/770,998

(22) PCT Filed: Dec. 13, 2018

(86) PCT No.: PCT/IB2018/059983
§ 371 (c)(1),
(2) Date: Jun. 9, 2020

(87) PCT Pub. No.: WO2019/123130
PCT Pub. Date: Jun. 27, 2019

(65) Prior Publication Data
US 2020/0372868 A1    Nov. 26, 2020

(30) Foreign Application Priority Data
Dec. 22, 2017 (JP) .............................. JP2017-245734

(51) Int. Cl.
G09G 3/36    (2006.01)
G02F 1/1362  (2006.01)
(Continued)

(52) U.S. Cl.
CPC ....... *G09G 3/3614* (2013.01); *G02F 1/13624* (2013.01); *G09G 3/3688* (2013.01);
(Continued)

(58) Field of Classification Search
CPC .. G09G 3/3614; G09G 3/3677; G09G 3/3688; G09G 2300/0809;
(Continued)

(56) References Cited

U.S. PATENT DOCUMENTS 5,854,616 A * 12/1998 Ota ...................... G09G 3/3614
                                                         345/100
6,028,578 A    2/2000 Ota et al.
(Continued)

FOREIGN PATENT DOCUMENTS

CN    001437319 A    8/2003
CN    101609235 A    12/2009
(Continued)

OTHER PUBLICATIONS

International Search Report (Application No. PCT/B2018/059983) dated Mar. 19, 2019.
(Continued)

*Primary Examiner* — Xuemei Zheng
(74) *Attorney, Agent, or Firm* — Fish & Richardson P.C.

(57) ABSTRACT

An object of the present invention is to provide a display device with high display quality. The display device of the present invention includes a pixel and a source driver circuit. The pixel includes first and second transistors (21, 22), a capacitor (25), and a display element (26). The source driver circuit is electrically connected to first and second wirings (31, 32). The first wiring (31) is electrically connected to one electrode of the capacitor 25 and one electrode of the display element (26) through the first transistor (21). The second wiring (32) is electrically connected to the other electrode of (Continued)

the capacitor (25) and the other electrode of the display element (26) through the second transistor (22).

20 Claims, 18 Drawing Sheets

(51) Int. Cl.
| | | |
|---|---|---|
| G02F 1/1368 | (2006.01) | |
| H01L 27/12 | (2006.01) | |
| H01L 29/24 | (2006.01) | |
| H01L 29/786 | (2006.01) | |

(52) U.S. Cl.
CPC ......... *G02F 1/1368* (2013.01); *G09G 3/3677* (2013.01); *G09G 2300/0426* (2013.01); *G09G 2300/0809* (2013.01); *H01L 27/124* (2013.01); *H01L 27/1225* (2013.01); *H01L 27/1255* (2013.01); *H01L 29/24* (2013.01); *H01L 29/7869* (2013.01)

(58) Field of Classification Search
CPC .... G09G 2310/0297; G09G 2300/0426; G02F 1/13624
See application file for complete search history.

(56) References Cited

U.S. PATENT DOCUMENTS

| | | |
|---|---|---|
| 6,198,464 B1 | 3/2001 | Ota et al. |
| 7,005,916 B2 | 2/2006 | Nakahira et al. |
| 7,425,940 B2 | 9/2008 | Kawachi |
| 7,586,504 B2 | 9/2009 | Nakahira et al. |
| 8,395,716 B2 | 3/2013 | Ishitani et al. |
| 8,471,794 B2 | 6/2013 | Nakahira et al. |
| 8,760,479 B2 | 6/2014 | Shin et al. |
| 9,348,188 B2 | 5/2016 | Shin et al. |
| 9,348,189 B2 | 5/2016 | Ishitani et al. |
| 10,031,362 B2 | 7/2018 | Hatsumi et al. |
| 10,095,071 B2 | 10/2018 | Ishitani et al. |
| 10,140,940 B2 | 11/2018 | Aoki |
| 2003/0146923 A1 | 8/2003 | Nakahira et al. |
| 2003/0189563 A1 | 10/2003 | Sato et al. |
| 2005/0190133 A1 | 9/2005 | Kawachi |
| 2008/0079679 A1 | 4/2008 | Ozawa |
| 2008/0238842 A1* | 10/2008 | Yatabe ................ G09G 3/3688 345/87 |
| 2009/0179847 A1 | 7/2009 | Harada et al. |
| 2009/0310047 A1 | 12/2009 | Shin et al. |
| 2010/0134710 A1* | 6/2010 | Ishitani ............ G02F 1/133514 349/46 |
| 2010/0225839 A1 | 9/2010 | Kim et al. |
| 2011/0128210 A1 | 6/2011 | Jung et al. |
| 2011/0279427 A1 | 11/2011 | Umezaki et al. |
| 2011/0285687 A1 | 11/2011 | Umezaki et al. |
| 2016/0154263 A1 | 6/2016 | Hatsumi et al. |
| 2018/0321531 A1 | 11/2018 | Hatsumi et al. |
| 2019/0129259 A1 | 5/2019 | Ishitani et al. |

FOREIGN PATENT DOCUMENTS

| | | |
|---|---|---|
| CN | 101750821 A | 6/2010 |
| DE | 10303427 | 10/2003 |
| EP | 0717304 A | 6/1996 |
| EP | 1054381 A | 11/2000 |
| JP | 11-119193 A | 4/1999 |
| JP | 2003-337560 A | 11/2003 |
| JP | 2005-258417 A | 9/2005 |
| JP | 2009-168931 A | 7/2009 |
| JP | 2009-301010 A | 12/2009 |
| JP | 2010-156960 A | 7/2010 |
| JP | 2016-110112 A | 6/2016 |
| KR | 2009-0077707 A | 7/2009 |
| KR | 2009-0130610 A | 12/2009 |
| KR | 2010-0063660 A | 6/2010 |
| KR | 2010-0100243 A | 9/2010 |
| TW | 200951930 | 12/2009 |
| WO | WO-1996/000408 | 1/1996 |

OTHER PUBLICATIONS

Written Opinion (Application No. PCT/IB2018/059983) dated Mar. 19, 2019.
European Search Report (Application No. 18890303.3), dated Jun. 23, 2021.

* cited by examiner

FIG. 10A1
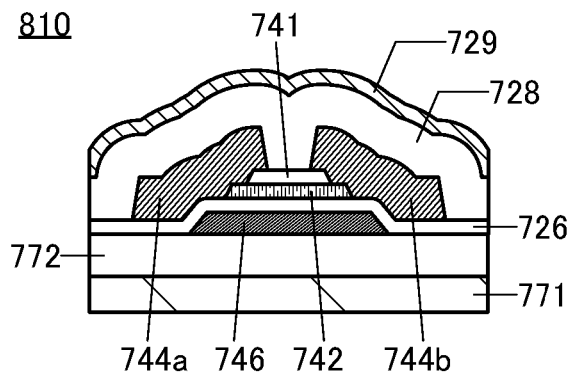
FIG. 10A2
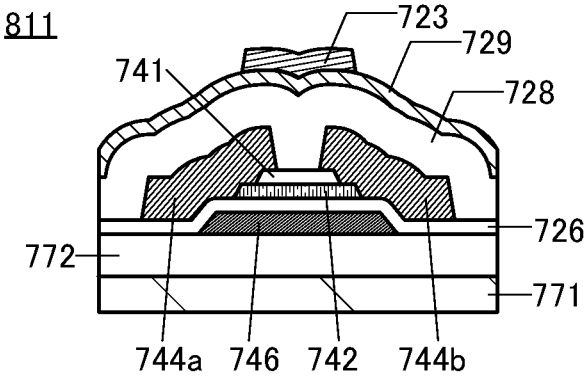
FIG. 10B1
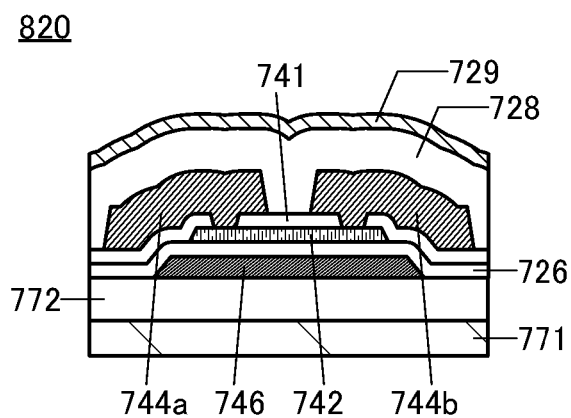
FIG. 10B2
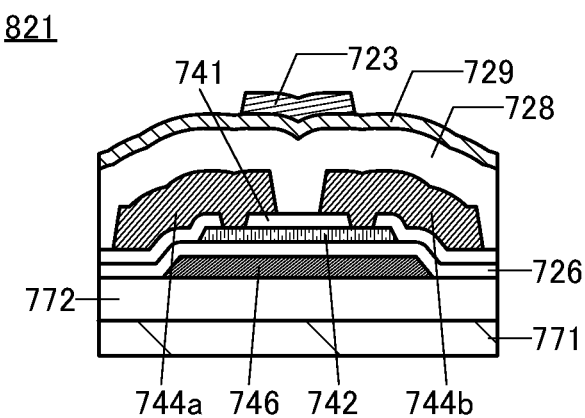
FIG. 10C1
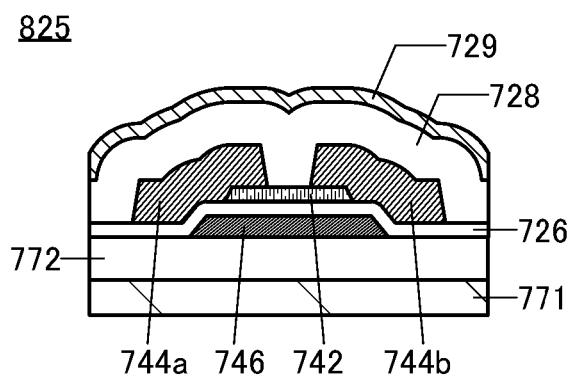
FIG. 10C2
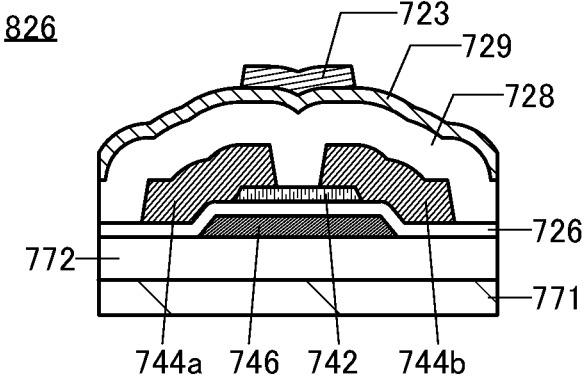

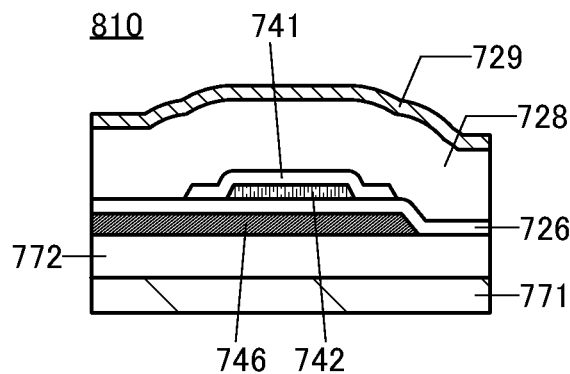
FIG. 11A1
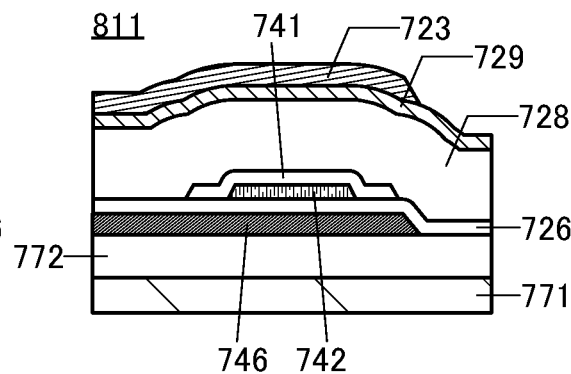
FIG. 11A2
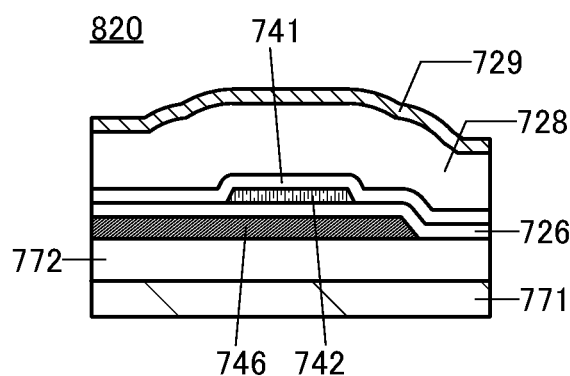
FIG. 11B1
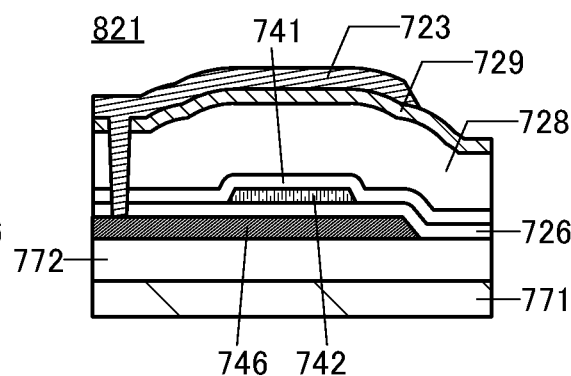
FIG. 11B2
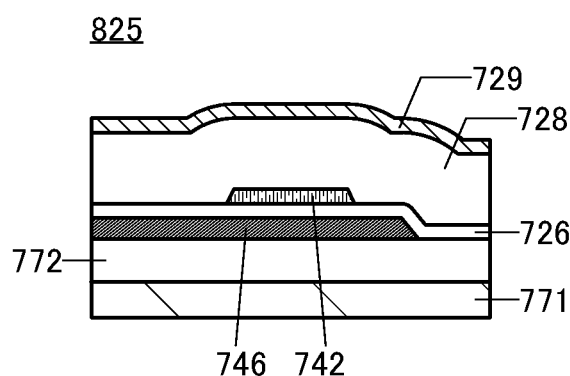
FIG. 11C1
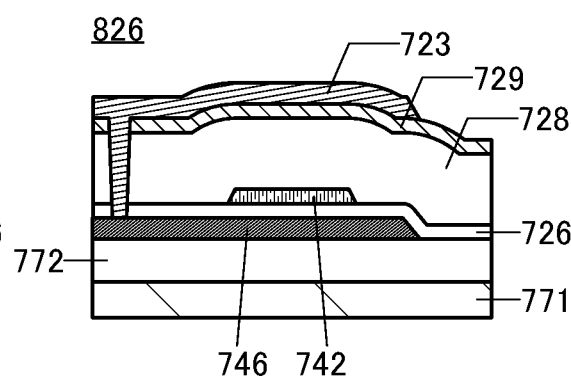
FIG. 11C2

FIG. 12A1
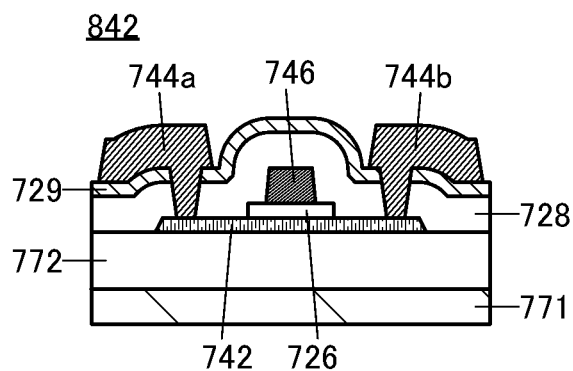
FIG. 12A2
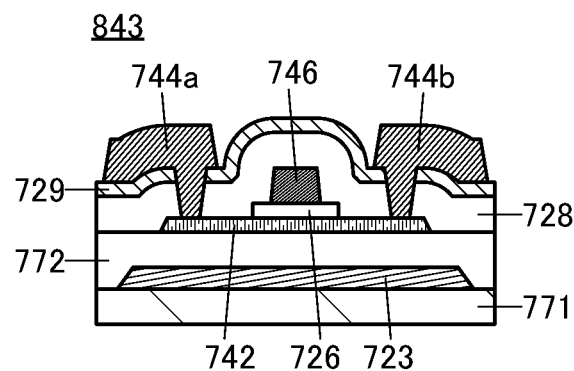
FIG. 12B1
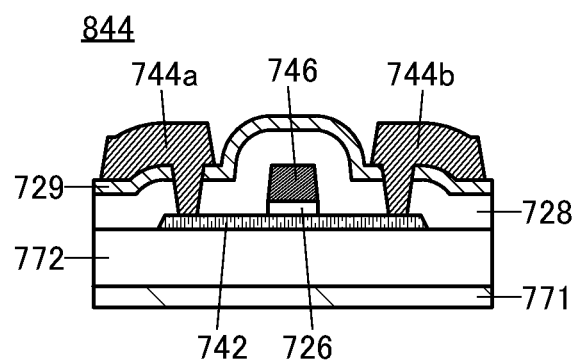
FIG. 12B2
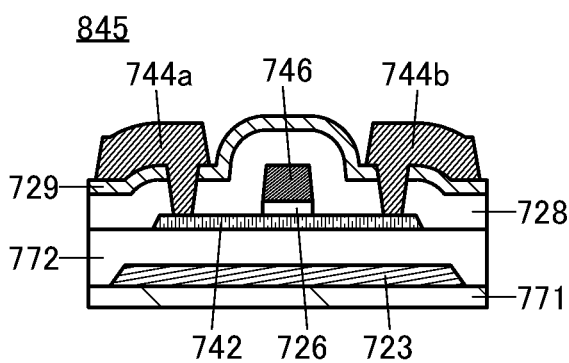
FIG. 12C1
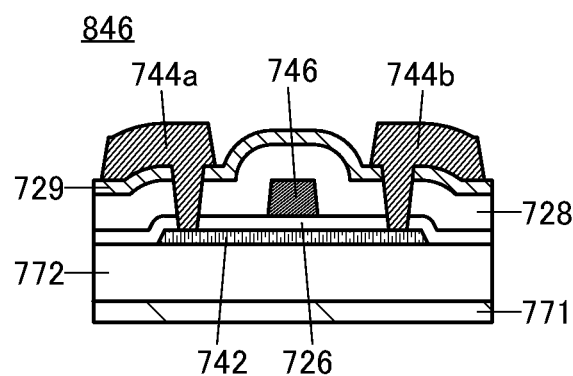
FIG. 12C2
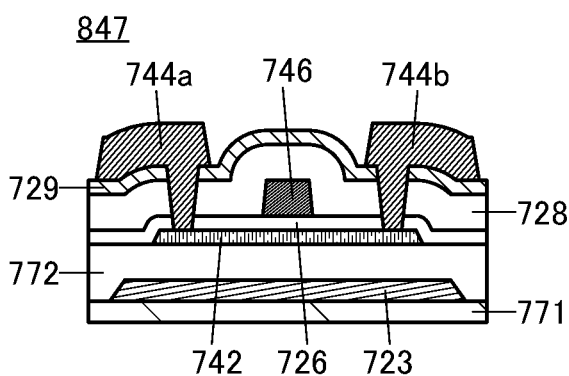

FIG. 13A1
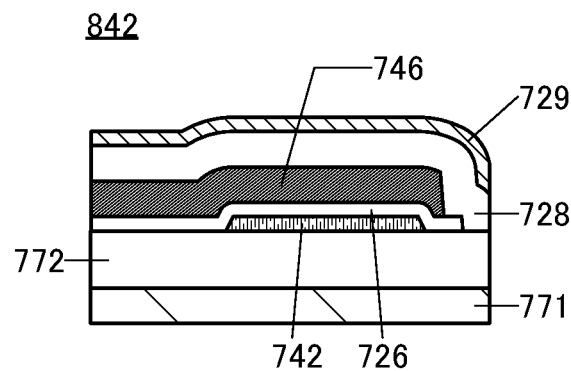
FIG. 13A2
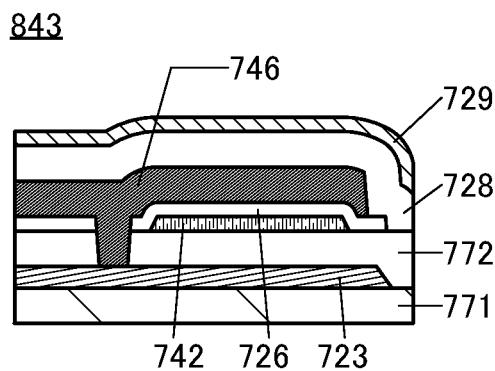
FIG. 13B1
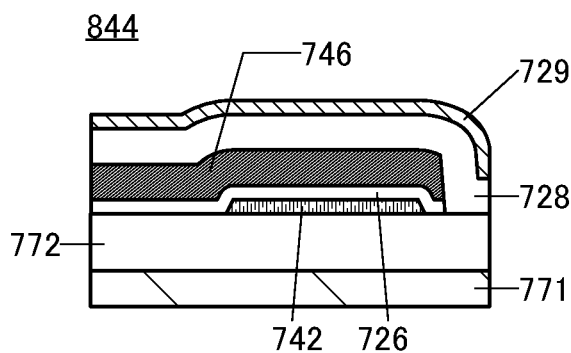
FIG. 13B2
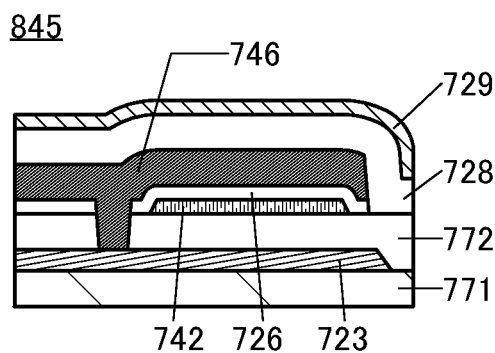
FIG. 13C1
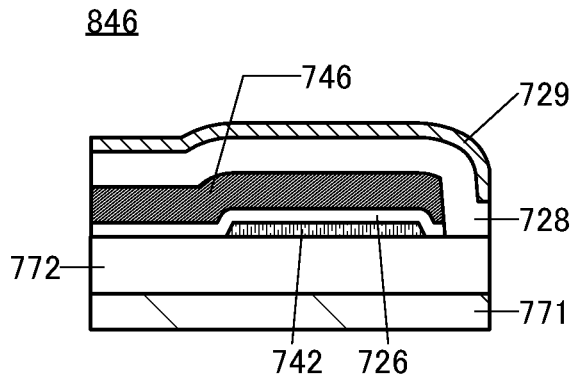
FIG. 13C2
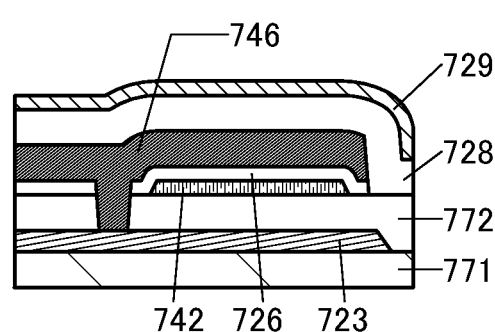

DISPLAY DEVICE INCLUDING PIXELS AND SOURCE DRIVE CIRCUIT

CROSS REFERENCE TO RELATED APPLICATIONS

This application is a U.S. National Phase Application under 35 U.S.C. § 371 of International Application PCT/IB2018/059983, filed on Dec. 13, 2018, which is incorporated by reference and claims the benefit of a foreign priority application filed in Japan on Dec. 22, 2017, as Application No. 2017-245734.

TECHNICAL FIELD

One embodiment of the present invention relates to a display device and an operation method thereof.

Note that one embodiment of the present invention is not limited to the above technical field. Examples of the technical field of one embodiment of the present invention include a semiconductor device, a display device, a light-emitting device, a display system, an electronic device, a lighting device, an input device (e.g., a touch sensor), an input-output device (e.g., a touch panel), a driving method thereof, and a manufacturing method thereof.

In this specification and the like, a semiconductor device generally means a device that can function by utilizing semiconductor characteristics. A display device (a liquid crystal display device, a light-emitting display device, and the like), a projection device, a lighting device, an electro-optical device, a power storage device, a memory device, a semiconductor circuit, an imaging device, an electronic device, and the like can be regarded as a semiconductor device, in some cases. Alternatively, it can be regarded that they include a semiconductor device, in some cases.

BACKGROUND ART

Display devices using liquid crystal elements as display elements have been developed. In general, a liquid crystal element tends to deteriorate when a DC voltage is continuously supplied. Thus, for a display device using a liquid crystal element as a display element, a driving method in which the polarity of a voltage applied to the liquid crystal element is inverted every frame period, for example, (also referred to as "frame inversion driving method") is used.

In the case where a display device is driven by a frame inversion mode, a driving method in which a potential supplied to a common electrode of a display element is kept constant (also referred to as "common DC driving method") during a period in which an image is displayed on the display device, and a driving method in which the polarity of a potential supplied to a common electrode is inverted every frame period, for example, (also referred to as "common inversion driving method") have been known. For example, Patent Document 1 discloses a liquid crystal display device that operates by a common inversion driving method.

REFERENCE

Patent Document

[Patent Document 1] Japanese Published Patent Application No. H11-119193

SUMMARY OF THE INVENTION

Problems to be Solved by the Invention

In the case where a display device is driven by a common DC driving method, a constant potential such as a ground potential is supplied to a common electrode of a display element. Therefore, to increase the difference between the potential supplied to a pixel electrode of the display element and the potential supplied to the common electrode, a high potential needs to be supplied to the pixel electrode. In contrast, in the case where the display device is driven by a common inversion driving method, even when the potential supplied to the pixel electrode is low, the difference between the potential supplied to the pixel electrode of the display element and the potential supplied to the common electrode can be large.

However, in the case where the display device is driven by a common inversion driving method, the polarities of potentials supplied to the common electrodes of all the display elements are inverted concurrently. Accordingly, the period from inversion of the polarity of the potential supplied to the common electrode to supply of the potential corresponding to an image data to the pixel electrode differs among pixels, and thus display unevenness is caused, and the display quality is reduced.

One object of one embodiment of the present invention is to provide a display device in which a potential supplied to one electrode of a display element and a potential supplied to the other electrode of the display element can be controlled for each pixel. Another object of one embodiment of the present invention is to provide a display device in which a potential supplied to one electrode of a display element and a potential supplied to the other electrode of the display element can be supplied from a source driver circuit. Another object of one embodiment of the present invention is to provide a display device in which display unevenness is reduced. Another object of one embodiment of the present invention is to provide a display device in which a high voltage can be supplied to a display element. Another object of one embodiment of the present invention is to provide a display device with high display quality. Another object of one embodiment of the present invention is to provide a display device with low power consumption. Another object of one embodiment of the present invention is to provide an inexpensive display device. Another object of one embodiment of the present invention is to provide a display device with high reliability. Another object of one embodiment of the present invention is to provide a small display device. Another object of one embodiment of the present invention is to provide a novel display device. Another object of one embodiment of the present invention is to provide a method for operating the above display device.

Note that the descriptions of these objects do not disturb the existence of other objects. One embodiment of the present invention does not need to achieve all the objects. Other objects can be derived from the descriptions of the specification, the drawings, and the claims.

Means for Solving the Problems

One embodiment of the present invention is a display device including a pixel and a source drive circuit, in which the pixel includes a first transistor, a second transistor, a capacitor, and a display element, one of a source and a drain of the first transistor is electrically connected to one electrode of the capacitor, the one electrode of the capacitor is electrically connected to one electrode of the display element, one of a source and a drain of the second transistor is electrically connected to the other electrode of the capacitor, the other electrode of the capacitor is electrically connected to the other electrode of the display element, the other of the source and the drain of the first transistor is electrically connected to the source driver circuit through a first wiring, and the other of the source and the drain of the second transistor is electrically connected to the source driver circuit through a second wiring.

In the above embodiment, the source driver circuit may have a function of supplying a first potential or a second potential to the second wiring, the source driver circuit may include a first resistor and a second resistor, the first potential may be supplied to one terminal of the first resistor, and the second potential may be supplied to one terminal of the second resistor.

In the above embodiment, the source driver circuit may include a first switch and a second switch, one terminal of the first resistor may be electrically connected to one terminal of the first switch, the other terminal of the first switch may be electrically connected to the second wiring, one terminal of the second resistor may be electrically connected to one terminal of the second switch, and the other terminal of the second switch may be electrically connected to the second wiring.

In the above embodiment, the first potential may be a positive potential, and the second potential may be a negative potential.

In the above embodiment, the absolute value of the first potential and the absolute value of the second potential may be the same or substantially the same.

In the above embodiment, a gate of the first transistor and a gate of the second transistor may be electrically connected to a third wiring.

In the above embodiment, the display device may include a gate driver circuit, and the third wiring may be electrically connected to the gate driver circuit.

In the above embodiment, the display element may be a liquid crystal element.

In the above embodiment, the display element may be a liquid crystal element employing a horizontal electric field mode.

In the above embodiment, the display element may include a liquid crystal exhibiting a blue phase.

In the above embodiment, each of the first transistor and the second transistor may include a metal oxide in its channel formation region, and the metal oxide may include In, Zn, and M (M is Al, Ti, Ga, Sn, Y, Zr, La, Ce, Nd, or Hf).

In the above embodiment, the pixel may include a third transistor, one of a source and a drain of the third transistor may be electrically connected to the other electrode of the display element, and the one of the source and the drain of the third transistor may be electrically connected to a common wiring.

In the above embodiment, the third transistor may include a metal oxide in its channel formation region, and the metal oxide may include In, Zn, and M (M is Al, Ti, Ga, Sn, Y, Zr, La, Ce, Nd, or Hf).

Effect of the Invention

According to one embodiment of the present invention, a display device in which a potential supplied to one electrode of a display element and a potential supplied to the other electrode of a display element can be controlled for each pixel can be provided. According to one embodiment of the present invention, a display device in which a potential supplied to one electrode of a display element and a potential supplied to the other electrode of the display element can be supplied from a source driver circuit can be provided. According to one embodiment of the present invention, a display device in which display unevenness is reduced can be provided. According to one embodiment of the present invention, a display device that can supply a high voltage to a display element can be provided. According to one embodiment of the present invention, a display device with high display quality can be provided. According to one embodiment of the present invention, a display device with low power consumption can be provided. According to one embodiment of the present invention, an inexpensive display device can be provided. According to one embodiment of the present invention, a highly reliable display device can be provided. According to one embodiment of the present invention, a small display device can be provided. According to one embodiment of the present invention, a novel display device can be provided. According to one embodiment of the present invention, a method for operating the above display device can be provided.

Note that the descriptions of the effects do not disturb the existence of other effects. One embodiment of the present invention does not need to have all the effects. Other effects can be derived from the descriptions of the specification, the drawings, and the claims.

BRIEF DESCRIPTION OF THE DRAWINGS

FIGS. 10A1, 10A2, 10B1, 10B2, 10C1, and 10C2 Diagrams illustrating examples of a transistor.

FIGS. 11A1, 11A2, 11B1, 11B2, 11C1, and 11C2 Diagrams illustrating an example of a transistor.

FIGS. 12A1, 12A2, 12B1, 12B2, 12C1, and 12C2 Diagrams illustrating an example of a transistor.

FIGS. 13A1, 13A2, 13B1, 13B2, 13C1, and 13C2 Diagrams illustrating an example of a transistor.

MODE FOR CARRYING OUT THE INVENTION

Figure 1:
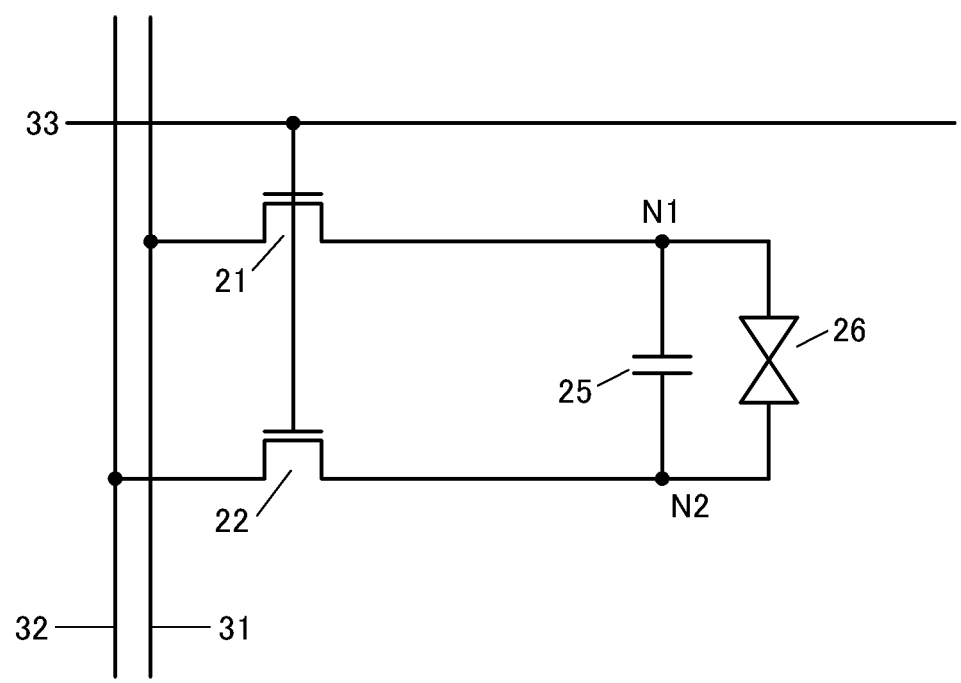
FIG. 1 A diagram illustrating an example of a pixel.

Embodiments will be described in detail with reference to the drawings. Note that the present invention is not limited to the following description, and it will be readily appreciated by those skilled in the art that modes and details of the present invention can be modified in various ways without departing from the spirit and scope of the present invention. Thus, the present invention should not be construed as being limited to the descriptions in the following embodiments.

Note that in structures of the present invention described below, the same portions or portions having similar functions are denoted by the same reference numerals in different drawings, and a description thereof is not repeated. Furthermore, the same hatch pattern is used for the portions having similar functions, and the portions are not especially denoted by reference numerals in some cases.

In addition, the position, size, range, or the like of each structure illustrated in drawings does not represent the actual position, size, range, or the like in some cases for easy understanding. Therefore, the disclosed invention is not necessarily limited to the position, size, range, or the like disclosed in the drawings.

Note that the term "film" and the term "layer" can be interchanged with each other depending on the case or circumstances. For example, the term "conductive layer" can be changed into the term "conductive film". As another example, the term "insulating film" can be changed into the term "insulating layer".

In this specification and the like, a metal oxide is an oxide of metal in a broad sense. Metal oxides are classified into an oxide insulator, an oxide conductor (including a transparent oxide conductor), an oxide semiconductor (also simply referred to as an OS), and the like. For example, in the case where a metal oxide is used in a semiconductor layer of a transistor, the metal oxide is referred to as an oxide semiconductor in some cases. That is, an OS FET can also be called a transistor including a metal oxide or an oxide semiconductor.

Furthermore, in this specification and the like, a metal oxide containing nitrogen is in some cases also collectively referred to as a metal oxide. A metal oxide containing nitrogen may be referred to as a metal oxynitride.

Embodiment 1

In this embodiment, a display device of one embodiment of the present invention will be described with reference to the drawings.

One embodiment of the present invention relates to a display device including a pixel, a source driver circuit, and a gate driver circuit. The pixel includes first and second transistors, a capacitor, and a display element. The source driver circuit is electrically connected to first and second wirings. The first wiring is electrically connected to one electrode of the capacitor and one electrode of the display element through the first transistor. The second wiring is electrically connected to the other electrode of the capacitor and the other electrode of the display element through the second transistor. The gate driver circuit is electrically connected to a third wiring, and the third wiring is electrically connected to gates of the first and second transistors. With the pixel that is provided in the display device of one embodiment of the present invention having the above structure, both a potential supplied to the one electrode of the display element and a potential supplied to the other electrode of the display element can be controlled for each pixel.

Here, a liquid crystal element can be used as the display element. The first and second wirings can be used as signal lines, and the third wiring can be used as a scan line.

The source driver circuit has a function of supplying an image signal to the first wiring to supply a potential corresponding to the image signal to the one electrode of the display element. The source driver circuit has a function of supplying a first or second potential to the second wiring to supply the first or second potential to the other electrode of the display element. Here, the second potential can be a potential obtained by inverting the polarity of the first potential.

In this specification and the like, a potential whose polarity is inverted refers to a potential obtained by inverting the polarity of a voltage applied to the display element. For example, in the case where a potential supplied to the other electrode of the display element is the first potential or the second potential, and the first potential is a potential higher than or equal to a potential supplied to the one electrode of the display element and the second potential is a potential lower than or equal to the potential supplied to the one electrode of the display element, the first potential and the second potential can be referred to as potentials with inverted polarities.

Alternatively, a potential obtained by reversing the magnitude relationship with a reference potential is referred to as a potential whose polarity is inverted in some cases. For example, when the reference potential is a ground potential, a potential obtained by reversing a positive and a negative is referred to as a potential whose polarity is inverted in some cases.

For example, the first potential can be a positive potential, and the second potential can be a negative potential. In this case, the absolute value of the first potential and the absolute value of the second potential can be the same or substantially the same. Here, it can be said that when the difference between the absolute value of the first potential and the absolute value of the second potential is lower than or equal to 0.1 V, for example, the absolute value of the first potential is substantially the same as the absolute value of the second potential.

In this specification and the like, a voltage applied to the display element refers to a potential difference between the potential supplied to the one electrode of the display element and the potential supplied to the other electrode of the display element. Inversion of the polarity of a voltage applied to the display element" indicates that a voltage applied to the display element is switched from a positive to a negative or switched from a negative to a positive.

In one embodiment of the present invention, when the display device performs frame inversion driving, not only a potential supplied to the one electrode of the display element but also a potential supplied to the other electrode of the display element is switched. Thus, even when a potential corresponding to an image signal is low, a voltage applied to the display element can be higher than that in the case where frame inversion driving is performed by inverting only a potential supplied to the one electrode of the display element. Accordingly, even in the case where a high voltage is applied to the display element, the power consumption of the display device of one embodiment of the present invention can be low. Moreover, as the source driver circuit, a source driver circuit with high withstand voltage does not need to be used; therefore, the display device of one embodiment of the present invention can be inexpensive.

In this specification and the like, a high voltage sometimes means a large absolute value of a potential difference. Moreover, a low voltage sometimes means a small absolute value of a potential difference. In other words, when the level of a voltage is described, the polarity of the voltage is not taken into consideration in some cases.

As described above, in the display device of one embodiment of the present invention, both the potential supplied to the one electrode of the display element and the potential supplied to the other electrode of the display element can be controlled for each pixel. Thus, a period from switching of the potential supplied to the other electrode of the display element to supply of a potential corresponding to an image signal to the one electrode of the display element can be equivalent among the pixels. For example, in all the pixels included in the display device of one embodiment of the present invention, timing at which a potential corresponding to an image signal is supplied to the one electrode of the display element can coincide with timing at which a potential supplied to the other electrode of the display element is switched. Thus, display unevenness of an image displayed on the display device can be reduced and the display quality can be improved more than in the case where a common electrode is used as the other electrode of the display element.

1-1. Structure Example 1 of Pixel

FIG. 1 is a diagram illustrating a pixel 11a that can be used for the display device of one embodiment of the present invention. The pixel 11a includes a transistor 21, a transistor 22, a capacitor 25, and a display element 26. For example, a liquid crystal element can be used as the display element 26.

One of a source and a drain of the transistor 21 is electrically connected to one electrode of the capacitor 25. The one electrode of the capacitor 25 is electrically connected to one electrode of the display element 26. One of a source and a drain of the transistor 22 is electrically connected to the other electrode of the capacitor 25. The other electrode of the capacitor 25 is electrically connected to the other electrode of the display element 26.

Here, a wiring to which the one of the source and the drain of the transistor 21, the one electrode of the capacitor 25, and the one electrode of the display element 26 are connected is a node N1. A wiring to which the one of the source and the drain of the transistor 22, the other electrode of the capacitor 25, and the other electrode of the display element 26 are connected is a node N2.

The other of the source and the drain of the transistor 21 is electrically connected to a wiring 31. The other of the source and the drain of the transistor 22 is electrically connected to a wiring 32. A gate of the transistor 21 and a gate of the transistor 22 are electrically connected to a wiring 33.

The wiring 31 has a function as a signal line for supplying an image signal to the pixel 11a. The wiring 32 has a function as a signal line for supplying a first potential and a second potential to the pixel 11a. The wiring 33 has a function as a scan line for controlling the transistor 21 and the transistor 22.

Here, the second potential can be a potential obtained by inverting the polarity of the first potential. For example, the first potential can be a positive potential, and the second potential can be a negative potential. The absolute value of the first potential and the absolute value of the second potential can be the same or substantially the same.

The transistor 21 has a function of controlling supply of an image signal to the pixel 11a. The transistor 22 has a function of controlling supply of the first potential and the second potential to the pixel 11a.

A potential corresponding to an image signal is retained at the node N1. The first potential or the second potential is retained at the node N2. Accordingly, the use of a transistor with extremely low off-state current as each of the transistor 21 and the transistor 22 enables long-term retention of the potentials of the node N1 and the node N2. As the transistor, a transistor using a metal oxide in a channel formation region (hereinafter referred to as an OS transistor) can be used, for example.

As a semiconductor material used for an OS transistor, a metal oxide whose energy gap is greater than or equal to 2 eV, preferably greater than or equal to 2.5 eV, further preferably greater than or equal to 3 eV can be used. A typical example is an oxide semiconductor containing indium, and a CAAC-OS or a CAC-OS described later can be used, for example. The CAAC-OS is an oxide semiconductor with high crystallinity. A transistor using the oxide semiconductor with high crystallinity can have improved reliability and thus is favorably used for the display device of one embodiment of the present invention. A CAC-OS exhibits excellent mobility characteristics and thus is suitable for a transistor that operates at high speed, for example.

An OS transistor has a large energy gap and thus exhibits extremely low off-state current characteristics. An OS transistor has features that impact ionization, an avalanche breakdown, a short-channel effect, and the like do not occur, for example, which are different from those of a transistor containing Si in its channel formation region (hereinafter referred to as an Si transistor), leading to formation of a highly reliable circuit.

Note that Si transistors may be used as the transistor 21 and the transistor 22.

Alternatively, an OS transistor may be used as one of the transistor 21 and the transistor 22, and a Si transistor may be used as the other. Examples of the Si transistor include a transistor containing amorphous silicon, a transistor containing crystalline silicon (typically, low-temperature polysilicon), and a transistor containing single crystal silicon.

When the pixel 11a has the structure illustrated in FIG. 1, a potential supplied to the other electrode of the display element 26 can be controlled for each pixel 11a.

Next, an example of a method for operating the pixel 11a will be described with reference to a timing chart shown in FIG. 2. Here, a potential V1 can be the first potential, and a potential V2 can be the second potential. In addition, each of Time T01 to Time T03 and Time T04 to Time T06 can be one frame period.

When the potential of the wiring 33 is set to a high potential at Time T01, the transistor 21 and the transistor 22 are turned on. After that, when the potential of the wiring 31 is set to a potential $V_{IS1}$ that is a potential corresponding to an image signal and the potential of the wiring 32 is set to the potential V2 at Time T02, the potential $V_{IS1}$ is written to the node N1 and the potential V2 is written to the node N2. Thus, the display element 26 performs display in accordance with the potential $V_{IS1}$.

When the potential of the wiring 33 is set to a low potential at Time T03, the transistor 21 and the transistor 22 are turned off, the potential $V_{IS1}$ is retained at the node N1, and the potential V2 is retained at the node N2.

In this specification and the like, a low potential can be a potential lower than or equal to the potential V2, for example. Furthermore, a high potential can be a potential higher than or equal to the potential V1, for example.

When the potential of the wiring 33 is set to a high potential at Time T04, the transistor 21 and the transistor 22 are turned on. After that, when the potential of the wiring 31 is set to a potential $V_{IS1}'$ and the potential of the wiring 32 is set to the potential V1 at Time T05, the potential of the node N1 becomes the potential $V_{IS1}'$ and the potential of the node N2 becomes the potential V1. Therefore, the polarity of a voltage applied to the display element 26 is inverted, whereby frame inversion driving is performed. Thus, in the case where the display element 26 is a liquid crystal element, deterioration of the display element 26 can be suppressed more than in the case where frame inversion driving is not performed; therefore, the display device of one embodiment of the present invention can have higher reliability. Furthermore, both the potential of the node N1 and the potential of the node N2 are switched to perform frame inversion driving, whereby even when a potential corresponding to an image signal is low, a voltage applied to the display element 26 can be higher than that in the case where only the potential of the node N1 is switched to perform frame inversion driving. Thus, even in the case where a high voltage is applied to the display element 26, the power consumption of the display device of one embodiment of the present invention can be low.

When the potential of the wiring 33 is set to a low potential at Time T06, the transistor 21 and the transistor 22 are turned off. The above is the example of the method for operating the pixel 11a.

As described above, in one embodiment of the present invention, a potential supplied to the wiring 32 is switched at regular intervals. The interval can be equal to an interval in which an image signal is supplied to the wiring 31 as shown in FIG. 2, for example. For example, the timing at which an image signal is supplied to the wiring 31 can coincide with the timing at which a potential supplied to the wiring 32 is switched.

As described above, in the display device of one embodiment of the present invention, both the potential supplied to the one electrode of the display element 26 and the potential supplied to the other electrode of the display element 26 can be controlled for each pixel 11a. That is, both the potential written to the node N1 and the potential written to the node N2 can be controlled for each pixel 11a. Thus, a period from writing of the first potential or the second potential to the node N2 to writing of a potential corresponding to an image signal to the node N1 can be equal among the pixels 11a. For example, in all the pixels 11a, as illustrated in FIG. 2, the timing at which a potential is written to the node N2 can coincide with the timing at which a potential is written to the node N1. Thus, display unevenness of an image displayed on the display device can be reduced and the display quality can be improved.

Note that each of the first potential and the second potential may be fixed or may be changed. For example, the first potential may be changed between 0 V and 5 V, and the second potential may be changed between −5 V and 0 V. Thus, an image signal supplied to the pixel 11a can be subjected to correction processing, for example.

1-2. Structure Example 2 of Pixel

Figure 3:
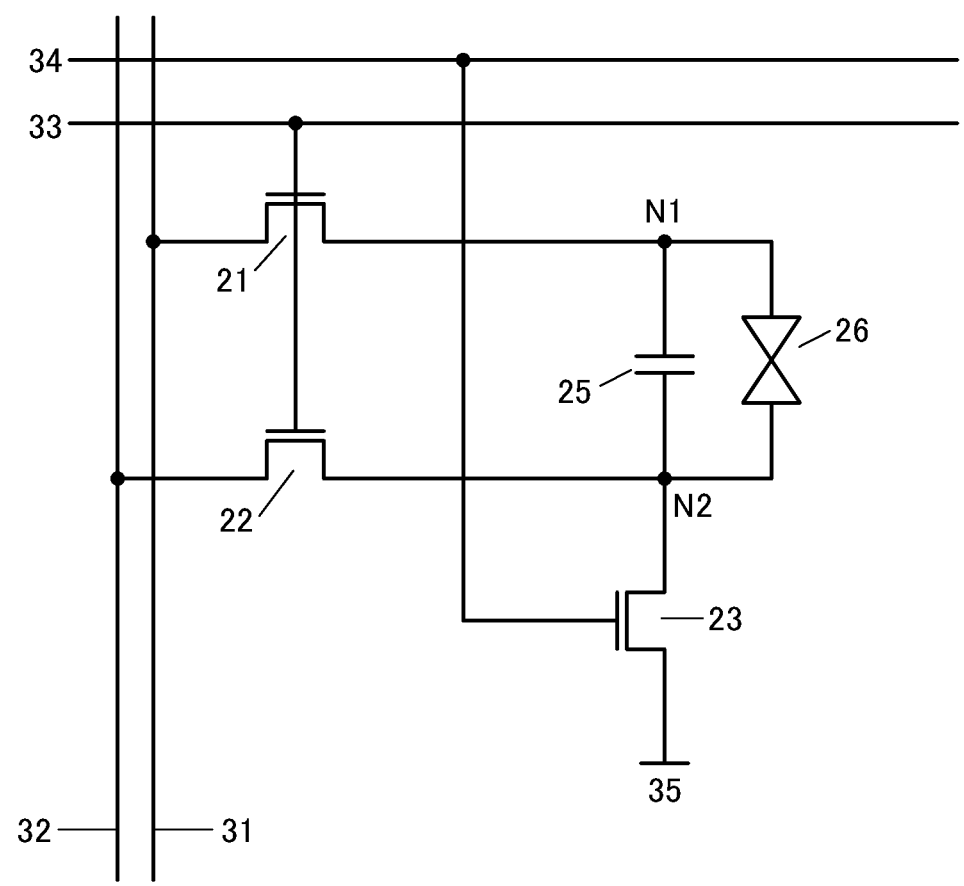
FIG. 3 A diagram illustrating an example of a pixel.

FIG. 3 is a diagram illustrating a pixel 11b that can be used for the display device of one embodiment of the present invention. The pixel 11b is a modification example of the pixel 11a and is different from the pixel 11a in that a transistor 23 is provided.

One of a source and a drain of the transistor 23 is electrically connected to the node N2. The other of the source and the drain of the transistor 23 is electrically connected to a wiring 35. A gate of the transistor 23 is electrically connected to a wiring 34.

The wiring 35 has a function as a common wiring. That is, a structure can be employed in which for example, the others of the sources and the drains of all the transistors 23 provided in the pixels 11b included in the display device of one embodiment of the present invention are electrically connected to one wiring 35. A constant potential is supplied to the wiring 35, and for example, a ground potential can be supplied. The wiring 34 has a function as a scan line for controlling the transistor 23.

As in the pixel 11a, the first potential or the second potential is retained at the node N2. Accordingly, as in the case of the transistor 22, the use of a transistor with extremely low off-state current, e.g., an OS transistor, as the transistor 23 enables long-term retention of the potential of the node N2. Note that a Si transistor may be used as the transistor 23.

Next, an example of a method for operating the pixel 11b will be described with reference to a timing chart shown in FIG. 4. Here, a potential supplied to the wiring 35 is a potential $V_{COM}$. In addition, each of Time T11 to Time T15 and Time T16 to Time T20 can be one frame period. The potential of the wiring 34 is set to a low potential at Time T11, and the potential of the wiring 33 is set to a high potential at Time T12. At Time T13, the potential of the wiring 31 is set to a potential $V_{IS2}$ that is a potential corresponding to an image signal, and the potential of the wiring 32 is set to the potential V2. Thus, the transistor 21 and the transistor 22 are turned on, and the potential $V_{IS2}$ is written to the node N1 and the potential V2 is written to the node N2. Thus, the display element 26 performs display in accordance with the potential $V_{IS2}$.

When the potential of the wiring 33 is set to a low potential at Time T14, the transistor 21 and the transistor 22 are turned off, the potential $V_{IS2}$ is retained at the node N1, and the potential V2 is retained at the node N2.

When the potential of the wiring 34 is set to a high potential at Time T15, the transistor 23 is turned on, and the potential of the node N2 becomes the potential $V_{COM}$. That is, the potential of the node N2 is increased by "$V_{COM}$−V2". Thus, in the case where the capacitive coupling coefficient of the node N1 is one, the potential of the node N1 is also increased by "$V_{COM}$−V2" and becomes a potential "$V_{IS2}$+$V_{COM}$−V2". In other words, the voltage applied to the display element 26 is not changed. Here, in the case where the potential $V_{IS2}$ is a positive potential, the potential "$V_{IS2}$+$V_{COM}$−V2" may be a potential higher than the potential V1. Note that the capacitive coupling coefficient of the node N1 is one also in the following description.

The potential of the wiring 34 is set to a low potential at Time T16, and the potential of the wiring 33 is set to a high potential at Time T17. At Time T18, the potential of the wiring 31 is set to a potential $V_{IS2}'$, and the potential of the wiring 32 is set to the potential V1. Thus, the transistor 21 and the transistor 22 are turned on, the potential of the node N1 is set to the potential $V_{IS2}'$, and the potential of the node N2 becomes the potential V1. Through the above steps, the polarity of a voltage applied to the display element 26 is inverted, and frame inversion driving is performed.

When the potential of the wiring 33 is set to a low potential at Time T19, the transistor 21 and the transistor 22 are turned off, the potential $V_{IS2}'$ is retained at the node N1, and the potential V1 is retained at the node N2.

When the potential of the wiring 34 is set to a high potential at Time T20, the transistor 23 is turned on, and the potential of the node N2 is set to the potential $V_{COM}$. That is, the potential of the node N2 is increased by "$V_{COM}$–V1", that is, decreased by "V1–$V_{COM}$." Thus, the potential of the node N1 is also increased by "$V_{COM}$–V1", that is, decreased by "V1–$V_{COM}$", and becomes a potential $V_{IS2}'$ $V_{COM}$–V1". In other words, the voltage applied to the display element 26 is not changed. Here, in the case where the potential $V_{IS2}'$ is a negative potential, the potential "$V_{IS2}'$+$V_{COM}$–V1" may be a potential lower than the potential V2. The above is the example of the method for operating the pixel 11b.

Figure 4:
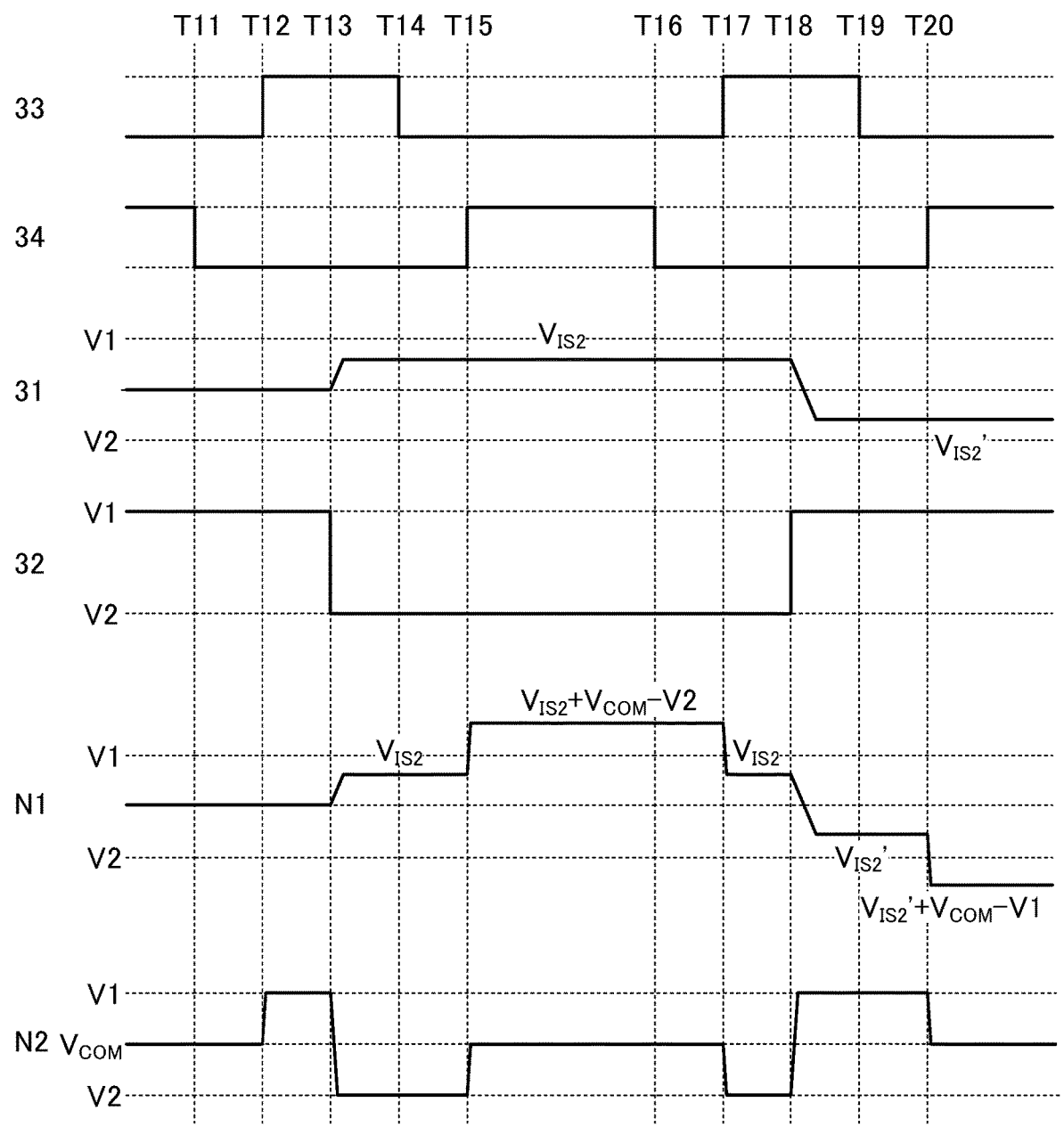
FIG. 4 A chart showing an example of operation of a pixel.

As shown in FIG. 4, by setting the potential of the node N2 to the potential $V_{COM}$ after a potential corresponding to an image signal is written to the node N1, the potential of the node N2 can be set to the potential $V_{COM}$ without changing the voltage applied to the display element 26. Thus, fluctuations in voltage applied to the display element 26 due to electrical noise or the like generated from the wiring 31 to the wiring 34, for example, can be inhibited. Accordingly, the display quality of an image displayed on the display device of one embodiment of the present invention can be improved.

1-3. Structure Example 3 of Pixel

Figure 5A:
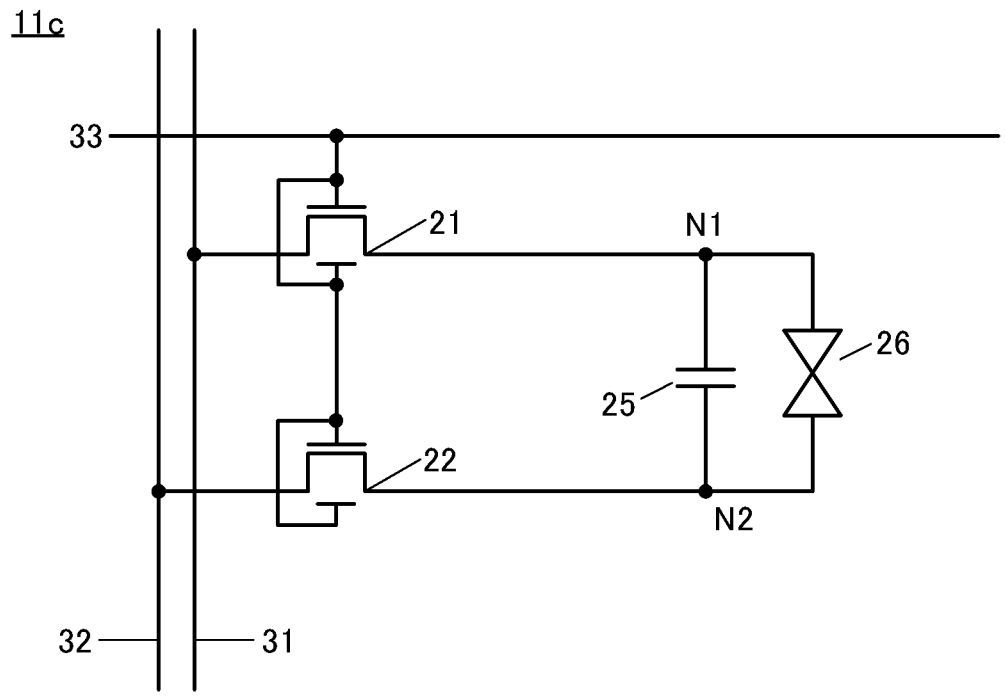
FIGS. 5A and 5B Diagrams illustrating examples of a pixel.
Figure 5B:
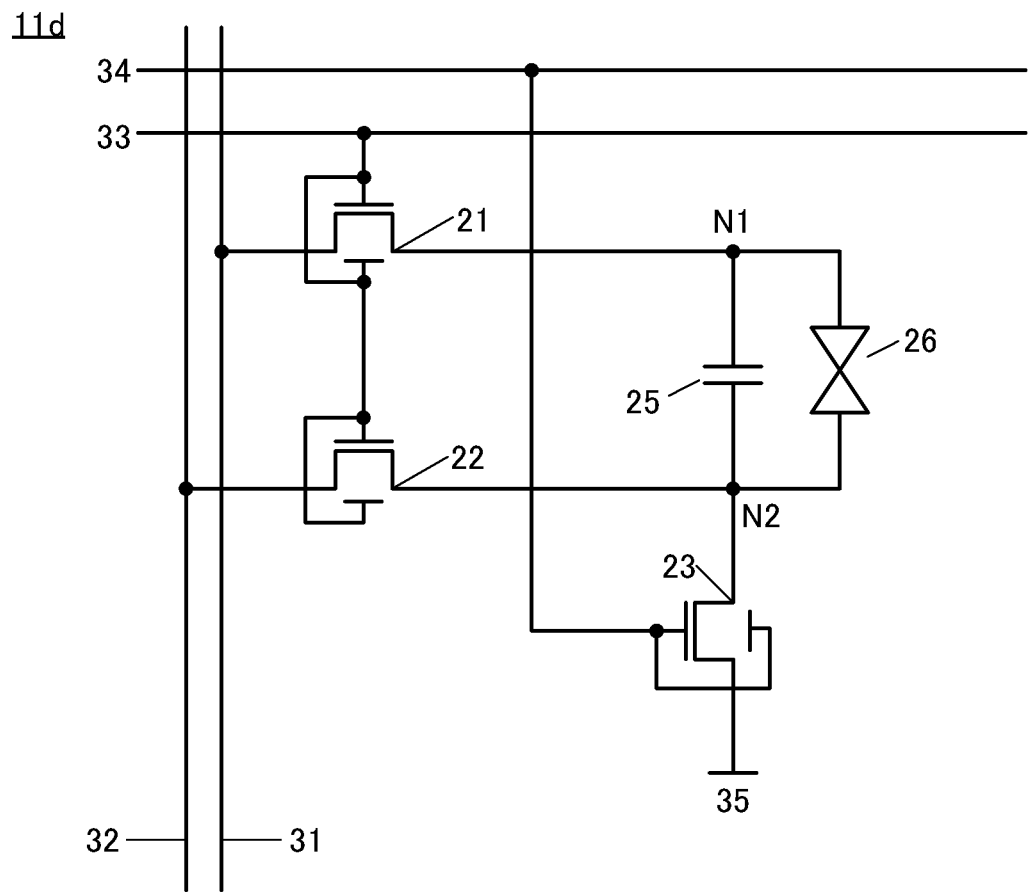

FIG. 5(A) is a diagram illustrating a pixel 11c that can be used for the display device of one embodiment of the present invention, and FIG. 5(B) is a diagram illustrating a pixel 11d that can be used for the display device of one embodiment of the present invention. The pixel 11c has a structure in which the transistor 21 and the transistor 22 provided in the pixel 11a are provided with back gates. The pixel 11d has a structure in which the transistor 21 to the transistor 23 provided in the pixel 11b are provided with back gates. The back gate can be electrically connected to a front gate of the transistor provided with the back gate, and an effect of increasing the on-state current is obtained. A structure in which different potentials can be supplied to the back gate and the front gate may be employed. In such a structure, the threshold voltage of the transistor can be controlled. Although all of the transistors included in the pixel are provided with back gates in each of FIG. 5(A) and FIG. 5(B), a transistor without a back gate may be included.

1-4. Structure Example 1 of Display Device

Figure 6:
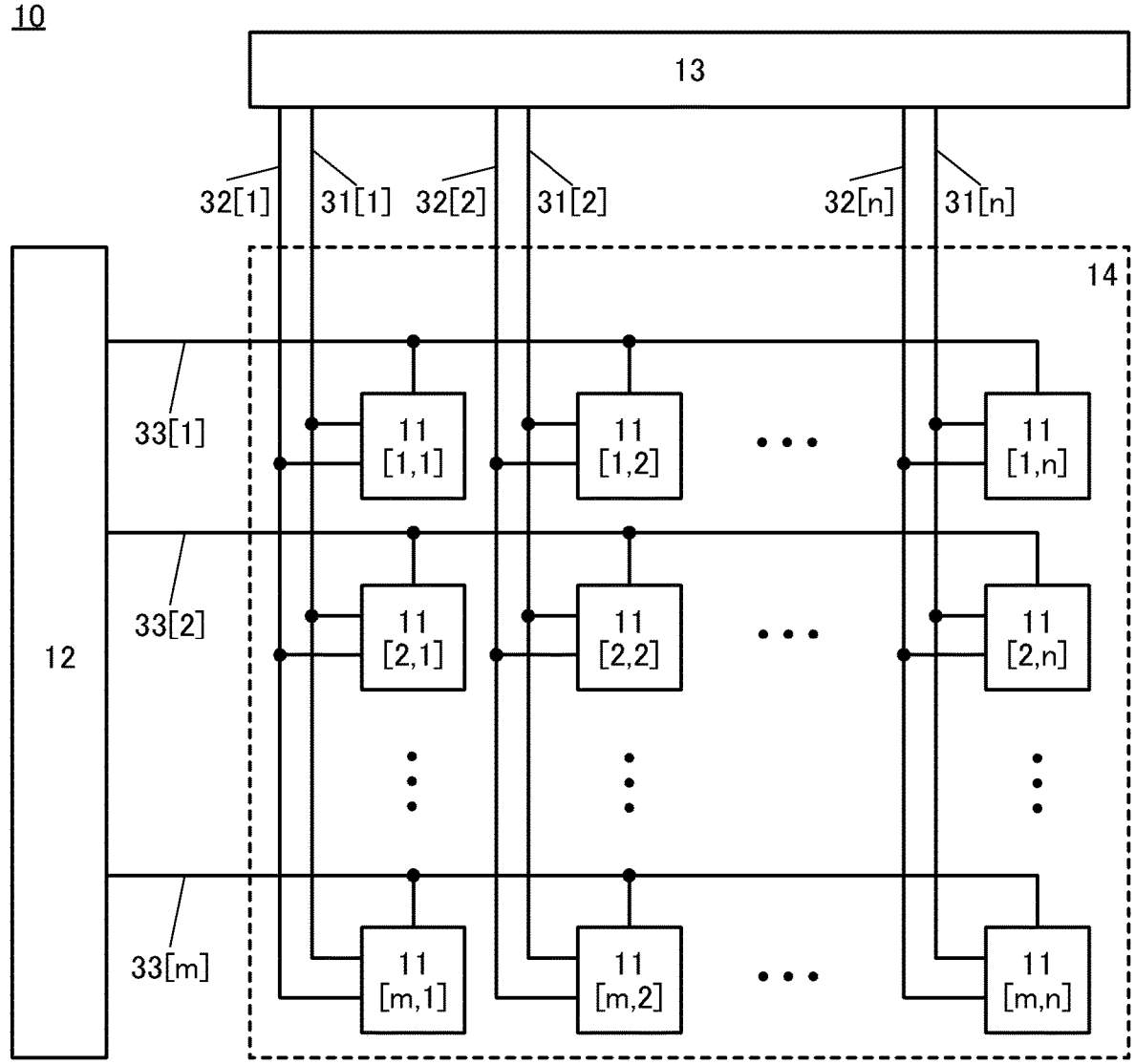
FIG. 6 A diagram illustrating an example of a display device.

FIG. 6 is a diagram illustrating a structure example of a display device 10 that is the display device of one embodiment of the present invention. The display device 10 includes a pixel array 14 in which the pixel 11 are arranged in matrix of m rows and n columns (m and n are each an integer of 2 or more), a gate driver circuit 12, and a source driver circuit 13. The wiring 33 is electrically connected to the gate driver circuit 12. The wiring 31 and the wiring 32 are electrically connected to the source driver circuit 13. As the pixels 11, the pixels 11a, the pixels 11b, the pixels 11c, the pixels 11d, or the like can be used.

In this specification and the like, the pixel 11 in an i-th row and a j-th column (i is an integer greater than or equal to 1 and less than or equal to m, and j is an integer greater than or equal to 1 and less than or equal to n) is denoted by a pixel 11[i, j]. The wiring 33 electrically connected to the pixels 11 in the i-th row is denoted by a wiring 33[i], and the wiring 31 and the wiring 32 electrically connected to the pixels 11 in the j-th column are denoted by a wiring 31[j] and a wiring 32[j], respectively.

The gate driver circuit 12 has a function of generating a selection signal that is a signal for selecting the pixel 11 and supplying the selection signal to the pixel 11 through the wiring 33. The potential of the wiring 33 becomes a potential corresponding to the selection signal generated by the gate driver circuit 12.

The source driver circuit 13 has a function of generating an image signal that is a signal corresponding to an image to be displayed using the pixel 11 and supplying the image signal to the pixel 11 through the wiring 31. The potential of the wiring 31 becomes a potential corresponding to the image signal generated by the source driver circuit 13. The source driver circuit 13 has a function of generating the first potential and the second potential and supplying the first potential and the second potential to the pixel 11 through the wiring 32.

As described above, in the display device of one embodiment of the present invention, even when a potential corresponding to an image signal is low, the voltage applied to the display element 26 can be high. Therefore, a source driver circuit with high withstand voltage does not need to be used as the source driver circuit 13. Therefore, the display device of one embodiment of the present invention can be inexpensive.

1-5. Structure Example 1 of Source Driver Circuit

Figure 7A:
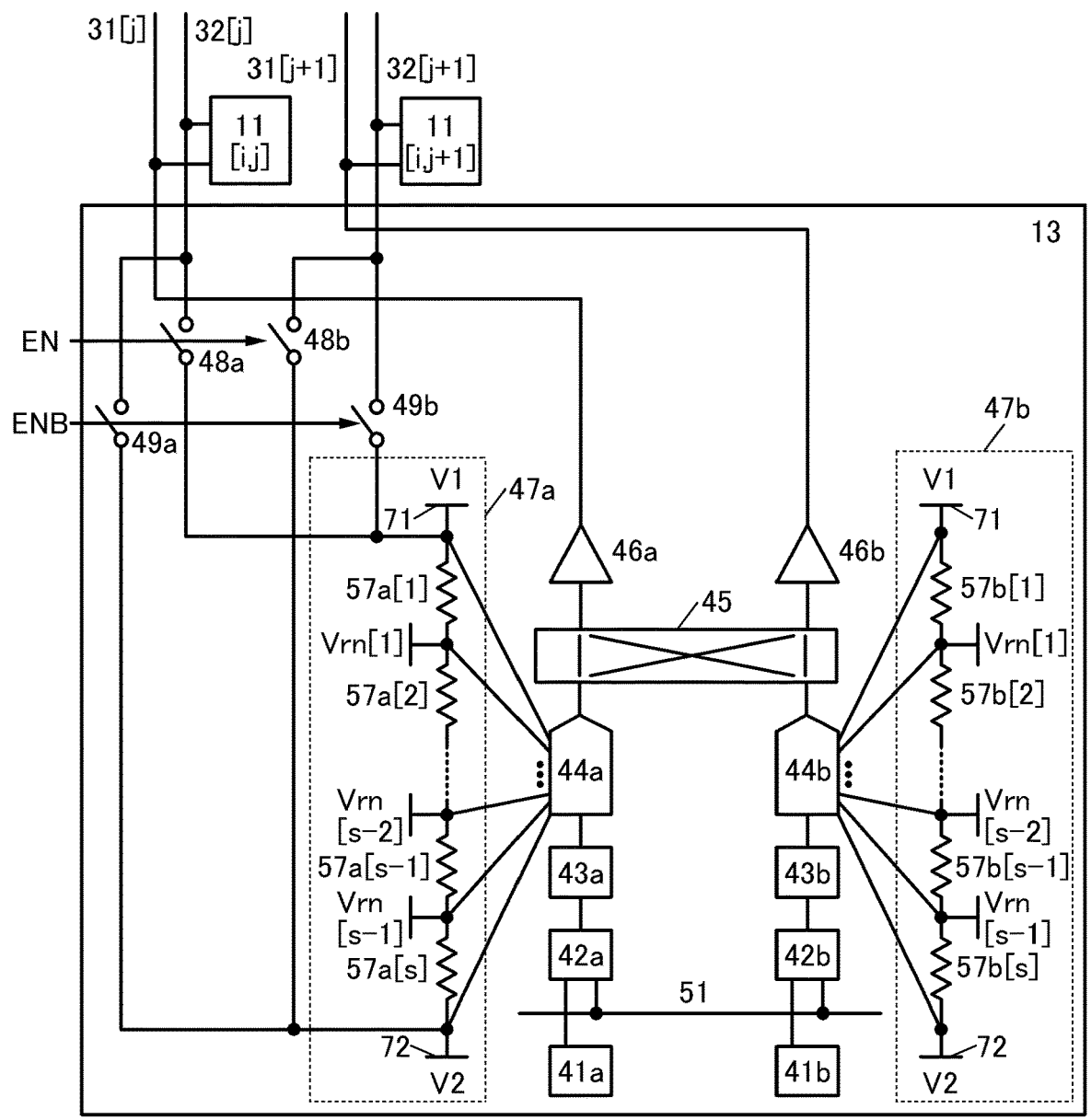
FIGS. 7A and 7B A diagram illustrating an example of a source driver circuit and a graph showing an example of characteristics of a pass transistor logic circuit.

FIG. 7(A) is a diagram illustrating a specific structure example of the source driver circuit 13. Note that FIG. 7(A) illustrates the pixel 11[i, j] and a pixel 11[i, j+1] in addition to the source driver circuit 13.

The source driver circuit 13 includes a shift register 41a and a shift register 41b; a latch circuit 42a and a latch circuit 42b; a level shift circuit 43a and a level shift circuit 43b; an N-type pass transistor logic circuit (hereinafter referred to as N-PTL) 44a and a P-type pass transistor logic circuit (hereinafter referred to as P-PTL) 44b; a selection circuit 45; an amplifier circuit 46a and an amplifier circuit 46b; a resistor string 47a and a resistor string 47b; a switch 48a and a switch 48b; and a switch 49a and a switch 49b. In addition, the resistor string 47a includes resistors 57a[1] to 57a[s] (s is an integer of 2 or more), and the resistor string 47b includes resistors 57b[1] to 57b[s]. Note that the N-PTL 44a and the resistor string 47a form a digital/analog converter circuit (hereinafter referred to as a DA converter circuit), and the P-PTL 44b and the resistor string 47b form a DA converter circuit. As each of the switch 48a, the switch 48b, the switch 49a, and the switch 49b, a CMOS transistor, an n-channel transistor, or a p-channel transistor can be used, for example.

An output terminal of the shift register 41a is electrically connected to a clock input terminal of the latch circuit 42a, and an output terminal of the shift register 41b is electrically connected to a clock input terminal of the latch circuit 42b. An input terminal of the latch circuit 42a and an input terminal of the latch circuit 42b are electrically connected to a data bus wiring 51. An output terminal of the latch circuit 42a is electrically connected to an input terminal of the level shift circuit 43a, and an output terminal of the latch circuit 42b is electrically connected to an input terminal of the level shift circuit 43b. An output terminal of the level shift circuit 43a is electrically connected to a signal input terminal of the N-PTL 44a, and an output terminal of the level shift circuit 43b is electrically connected to a signal input terminal of the P-PTL 44b. An output terminal of the N-PTL 44a and an output terminal of the P-PTL 44b are electrically connected to input terminals of the selection circuit 45. Output terminals of the selection circuit 45 is electrically connected to an input terminal of the amplifier circuit 46a and an input terminal of the amplifier circuit 46b. An output terminal of the amplifier circuit 46a is electrically connected to the wiring 31[j], and an output terminal of the amplifier circuit 46b is electrically connected to a wiring 31[j+1].

The resistors 57a[1] to 57a[s] are connected to each other in series, and the resistor 57b[1] to 57b[s] are connected to each other in series. The N-PTL44a includes s+1 input terminals, which are electrically connected to one terminals of the resistors 57a and/or the other terminals of the resistors 57a, as illustrated in FIG. 7(A). The N-PTL44b includes s+1 input terminals, which are electrically connected to one terminals of the resistors 57b and/or the other terminals of the resistors 57b, as illustrated in FIG. 7(A).

The potential V1, the potential V2, and potentials Vrn[1] to Vrn[s−1] are supplied to the resistor string 47a and the register string 47b through power supply lines. Specifically, the potential V1 is supplied to each of one terminal of the resistor 57a[1] and one terminal of the resistor 57b[1] through a power supply line 71. The potential Vrn[1] is supplied to each of one terminal of the resistor 57a[2] and one terminal of the resistor 57b[2]. The potential Vrn[s−2] is supplied to each of one terminal of the resistor 57a[s−1] and one terminal of the resistor 57b[s 1]. The potential Vrn[s−1] is supplied to each of one terminal of the resistor 57a[s] and one terminal of the resistor 57b[s]. The potential V2 is supplied to each of the other terminal of the resistor 57a[s] and the other terminal of the resistor 57b[s] through a power supply line 72. Here among the potential V1, the potential V2, and the potentials Vrn[1] to Vrn[s−1], the potential V1 is the highest potential, followed by the potentials Vrn[1] to Vrn[s−1] in this order, and the potential V2 is the lowest potential.

The power supply line 71 is electrically connected not only to the one terminal of the resistor 57a[1] but also to one terminal of the switch 48a, and one terminal of the switch 49b. The power supply line 72 is electrically connected not only to the other terminal of the resistor 57a[s] but also to one terminal of the switch 48b and one terminal of the switch 49a. The other terminal of the switch 48a and the other terminal of the switch 49a are electrically connected to the wiring 32[j]. The other terminal of the switch 48b and the other terminal of the switch 49b are electrically connected to a wiring 32 [/+1]. Note that the one terminal of the resistor 57b[1] may be electrically connected not only to the power supply line 71 but also to the one terminal of the switch 48a and the one terminal of the switch 49b, and the other terminal of the resistor 57b[s] may be electrically connected not only to the power supply line 72 but also to the one terminal of the switch 48b and the one terminal of the switch 49a.

A digital signal corresponding to an image single to be supplied to the pixel 11 is input to the input terminal of the latch circuit 42a and the input terminal of the latch circuit 42b from the data bus wiring 51.

The latch circuit 42a has a function of performing one of retention operation of the digital signal and output operation of the retained digital signal in response to a signal supplied from the shift register 41a. The latch circuit 42b has a function of performing one of retention operation of the digital signal and output operation of the retained digital signal in response to a signal supplied from the shift register 41b.

The level shift circuit 43a and the level shift circuit 43b have a function of converting an input signal into an output signal with a higher amplitude voltage or a lower amplitude voltage. Specifically, the level shift circuit 43a has a function of converting the amplitude voltage of a digital signal supplied from the latch circuit 42a into an amplitude voltage at which the DA converter circuit operates appropriately. The level shift circuit 43b has a function of converting the amplitude voltage of a digital signal supplied from the latch circuit 42b into an amplitude voltage at which the DA converter circuit operates appropriately.

Figure 7B:
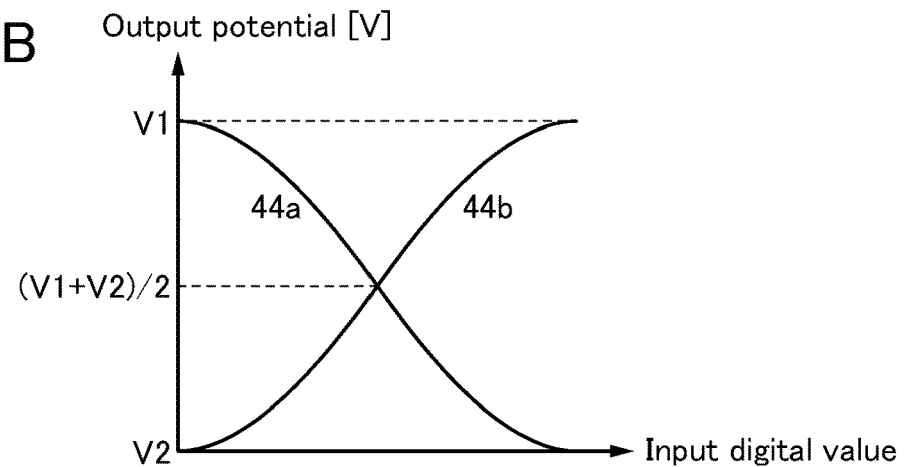

The N-PTL44a and the P-PTL44b have a function of outputting any of the potential V1, potentials Vrn[1] to Vrn[s], and the potential V2 as an analog signal on the basis of a digital value of an input digital signal. FIG. 7(B) is a graph showing the relationship between an output potential and an input digital value in each of the N-PTL44a and the P-PTL44b. As shown in FIG. 7(B), in the N-PTL44a, the larger the digital value of the input digital signal is, the lower the output potential is. For example, assuming that an 8-bit digital signal is input, the N-PTL 44a can output the potential V1 in the case where the digital value of the digital signal is 0 in decimal notation, and the N-PTL 44a can output the potential V2 in the case where the digital value is 255 in decimal notation.

As shown in FIG. 7(B), in the P-PTL 44b, the larger the digital value of the input digital signal is, the higher the output potential is. For example, assuming that an 8-bit digital signal is input, the N-PTL 44b can output the potential V2 in the case where the digital value of the digital signal is 0 in decimal notation, and the N-PTL 44b can output the potential V1 in the case where the digital value is 255 in decimal notation.

Figure 2:
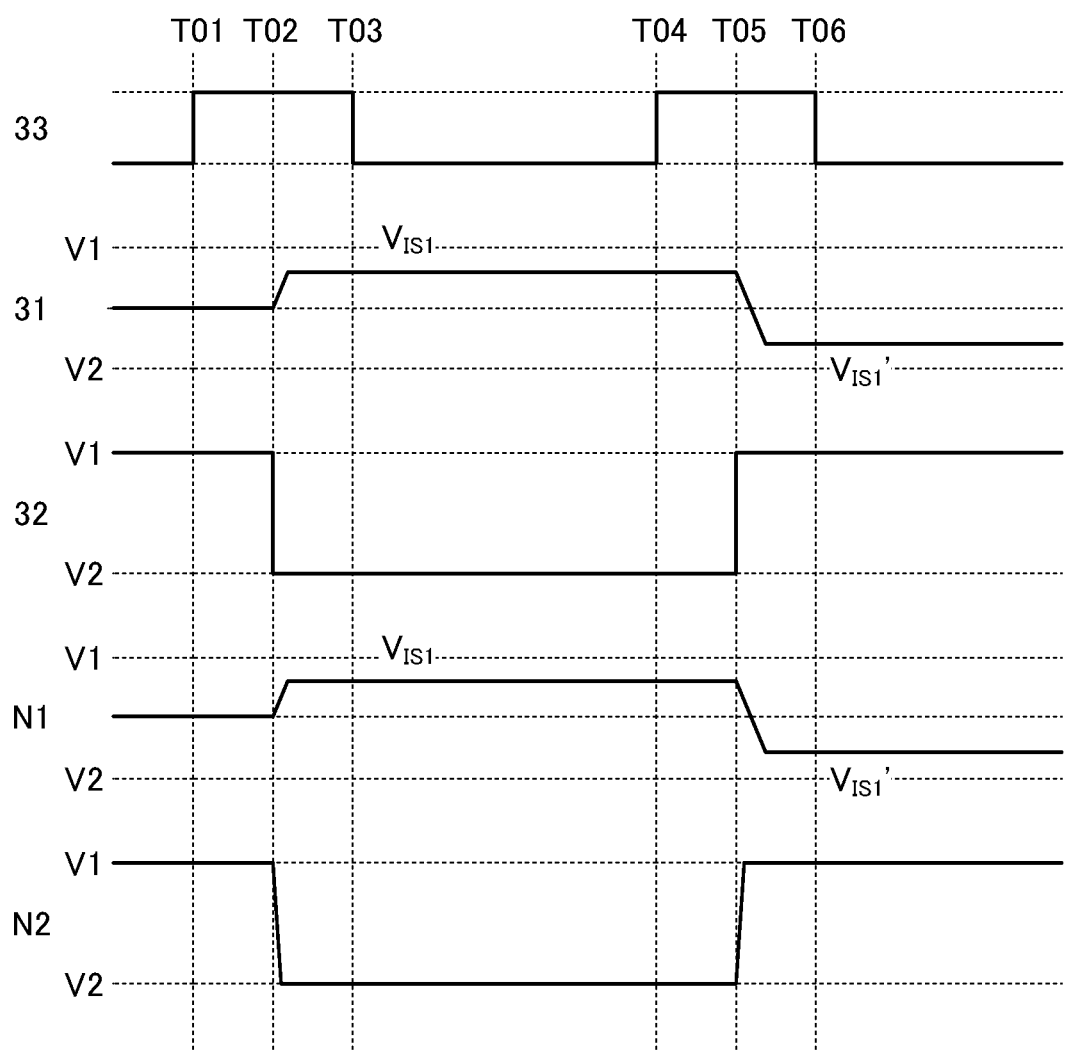
FIG. 2 A chart showing an example of operation of a pixel.

The potential output from the N-PTL44a can be the potential $V_{IS1}'$ shown in FIG. 2 or the potential $V_{IS2}'$ shown in FIG. 4, and the potential output from the P-PTL44b can be the potential $V_{IS1}$ shown in FIG. 2 or the potential $V_{IS2}$ shown in FIG. 4. That is, a potential corresponding to the potential output from the N-PTL44a is supplied to the node N1 included in the pixel 11 in which the potential of the node N2 is the potential V1. On the other hand, a potential corresponding to the potential output from the P-PTL44b is supplied to the node N1 included in the pixel 11 in which the potential of the node N2 is the potential V2.

Here, when the number of bits of the digital signal input to each of the N-PTL44a and the P-PTL44b is b (b is an integer of 1 or more), s can be denoted by "$2^b-1$". That is, in the case where the digital signal is an 8-bit signal, for example, the resistor string 47a can have a structure including 255 resistors 57a, and the resistor string 47b can have a structure including 255 resistors 57b.

Moreover, by adjustment of the potentials Vrn[1] to Vrn[s−1], the DA converter circuit can perform image processing on the input digital signal. For example, γ correction can be performed. By the image processing, the display quality of an image displayed on the display device 10 can be improved.

The selection circuit 45 has a function of supplying, to the input terminal of the amplifier circuit 46a, one of the potential output from the N-PTL44a and the potential output from the P-PTL44b and supplying the other to the input terminal of the amplifier circuit 46b.

The amplifier circuit 46a and the amplifier circuit 46b each have a function of amplifying the analog signal input to the input terminal and outputting the analog signal to the output terminal. By provision of the amplifier circuit 46a and the amplifier circuit 46b, an image signal can be stably supplied to the pixel 11. As the amplifier circuit 46a and the amplifier circuit 46b, a voltage follower circuit including an operational amplifier and the like can be used, for example. Note that in the case where a circuit including a differential input circuit is used as the amplifier circuit, the offset voltage of the differential input circuit is preferably set as close to 0 V as possible.

A control signal EN is supplied to the switch 48a and the switch 48b, and the on/off of the switch 48a and the switch 48b is controlled by the control signal EN. A control signal ENB is supplied to the switch 49a and the switch 49b, and the on/off of the switch 49a and the switch 49b is controlled by the control signal ENB. The control signal ENB is a complementary signal of the control EN; in the case where the switch 48a and the switch 48b are on, the switch 49a and the switch 49b can be turned off, and in the case where the switch 48a and the switch 48b are off, the switch 49a and the switch 49b can be turned on.

Each of the control signal EN and the control signal ENB can be a 1-bit signal, for example. In that case, when the value of the control signal EN is "1", the value of the control signal ENB is "0", and when the value of the control signal EN is "0", the value of the control signal ENB is "1". Here, the value of the control signal being "1" means the case where the potential of the control signal is a high potential, for example, and the value of the control signal being "0" means the case where the potential of the control signal is a low potential, for example. The control signal may be at a high potential when the value is "0", and the control signal may be at a low potential when the value is "1".

In the following description, in the case where the value of the control signal is "1", the switch supplied with the control signal is turned on, and in the case where the value of the control signal is "0", the switch supplied with the control signal is turned off. Note that in the case where the value of the control signal is "0", the switch supplied with the control signal may be turned on, and in the case where the value of the control signal is "1", the switch supplied with the control signal may be turned off.

When the value of the control signal EN is "1" and the value of the control signal ENB is "0", the switch 48a and the switch 48b are turned on, and the switch 49a and the switch 49b are turned off. Thus, the potential of the wiring 32 [j] becomes the potential V1, and the potential of the wiring 32 [j+1] becomes the potential V2. When the value of the control signal EN is "0" and the value of the control signal ENB is "1", the switch 49a and the switch 49b are turned on, and the switch 48a and the switch 48b are turned off. Thus, the potential of the wiring 32[j] becomes the potential V2, and the potential of the wiring 32[j+1] becomes the potential V1.

In this manner, by switching the values of the control signal EN and the control signal ENB, potentials supplied to the wiring 32 can be switched. Since the potential V2 can be a potential obtained by inverting the polarity of the potential V1 as described above, the polarities of the potentials supplied to the wiring 32 can be inverted by switching the values of the control signal EN and the control signal ENB.

Here, when the input digital values are equal to each other as shown in FIG. 7(B), the output potential of the P-PTL44b can be a potential obtained by inverting the polarity of the output potential of the N-PTL44a. In this manner, the values of the control signal EN and the control signal ENB are switched, and the potentials supplied to the input terminals of the amplifier circuit 46a and the amplifier circuit 46b are switched with the use of the selection circuit 45, whereby frame inversion driving can be performed.

As illustrated in FIG. 7(A), as a power source that supplies the potential V1 to the resistor string 47a that forms the DA converter circuit and a power source that supplies the potential V1 to the wiring 32, one power source can be shared. Furthermore, as a power source that supplies the potential V2 to the resistor string 47a that forms the DA converter circuit and a power source that supplies the potential V2 to the wiring 32, one power source can be shared. Thus, the potential can be supplied to the wiring 32 without an increase in the number of power sources provided in the display device 10. Consequently, an increase in the size of the display device 10 can be inhibited.

Note that the source driver circuit 13 can have a structure including n/2 shift registers 41a, n/2 shift registers 41b, n/2 latch circuits 42a, n/2 latch circuits 42b, n/2 level shift circuits 43a, n/2 level shift circuits 43b, n/2 N-PTLs 44a, n/2 P-PTLs 44b, n/2 selection circuits 45, n/2 amplifier circuits 46a, n/2 amplifier circuits 46b, n/2 resistor strings 47a, n/2 resistor strings 47b, n/2 switches 48a, n/2 switches 48b, n/2 switches 49a, and n/2 switches 49b. For example, a structure can be employed in which one control signal EN is supplied to the all the switches 48a and switches 48b, and a structure can be employed in which one control signal ENB is supplied to all the switches 49a and switches 49b.

1-6. Structure Example 2 of Source Driver Circuit

Figure 8A:
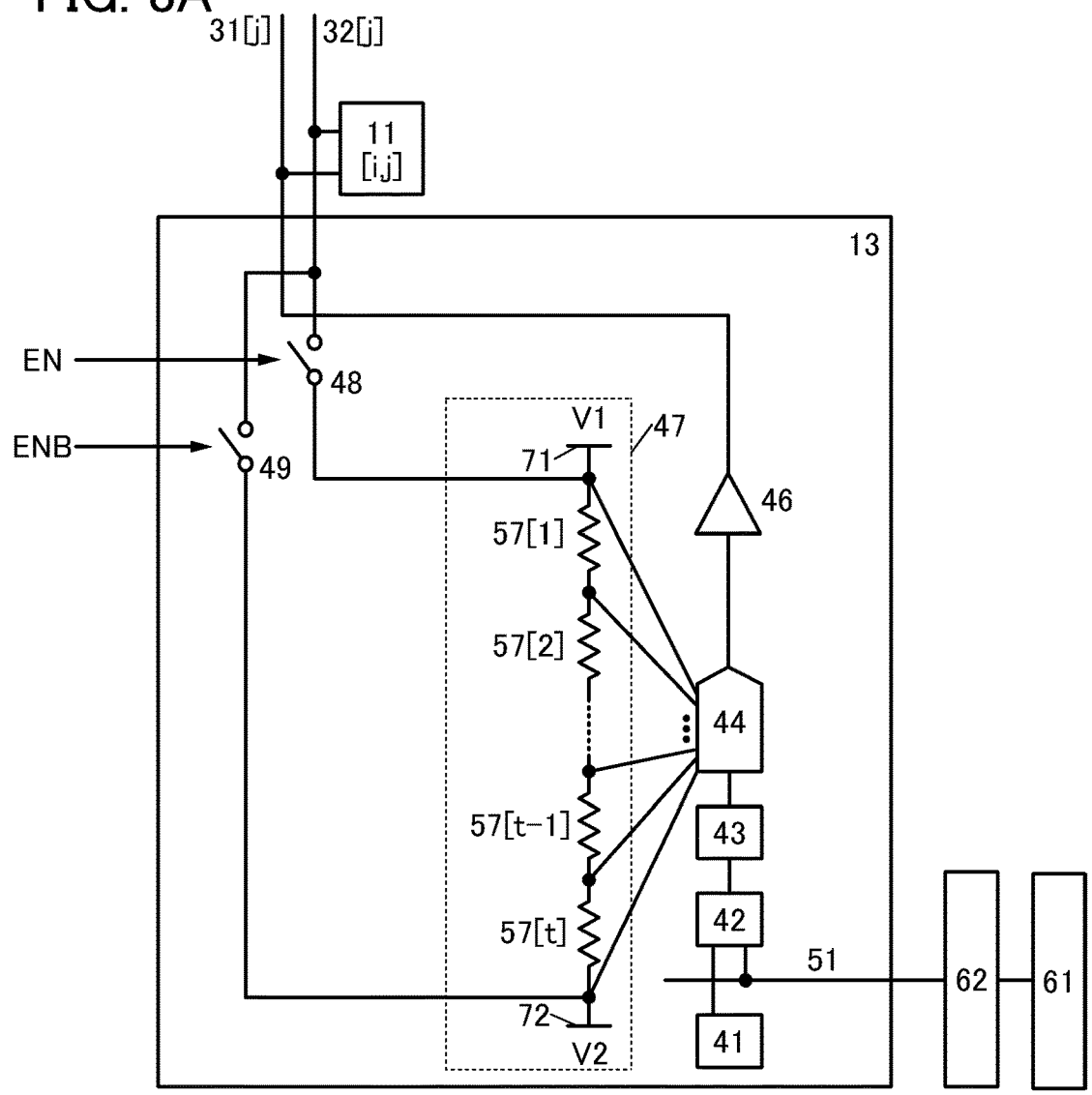
FIGS. 8A and 8B A diagram illustrating an example of a source driver circuit and a graph showing an example of characteristics of a pass transistor logic circuit.

FIG. 8(A) is a diagram illustrating the source driver circuit 13 having a structure different from that in FIG. 7(A). Note that FIG. 8(A) illustrates the pixel 11[i,j], a signal generation circuit 61, and a converter circuit 62 in addition to the source driver circuit 13.

The source driver circuit 13 includes a shift register 41, a latch circuit 42, a level shift circuit 43, a pass transistor logic circuit (hereinafter referred to as PTL) 44, an amplifier circuit 46, a resistor string 47, a switch 48, and a switch 49. The resistor string 47 includes resistors 57[1] to 57[t] (t is an integer of 2 or more). Note that the PTL 44 and the resistor string 47 form an DA converter circuit. As each of the switch 48 and the switch 49, a CMOS transistor, an n-channel transistor, or a p-channel transistor can be used, for example.

An output terminal of the signal generation circuit 61 is electrically connected to an input terminal of the converter circuit 62. An output terminal of the converter circuit 62 is electrically connected to an input terminal of the latch circuit 42 through the data bus wiring 51. An output terminal of the shift register 41 is electrically connected to a clock input terminal of the latch circuit 42. An output terminal of the latch circuit 42 is electrically connected to an input terminal of the level shift circuit 43. An output terminal of the level shift circuit 43 is electrically connected to a signal input terminal of the PTL 44. An output terminal of the PTL 44 is electrically connected to an input terminal of the amplifier circuit 46. An output terminal of the amplifier circuit 46 is electrically connected to the wiring 31[j]

The resistors 57[1] to 57[t] are connected in series. The PTL 44 includes t+1 input terminals, and each of the input terminals is electrically connected to one terminal of the resistor +57 and/or the other terminal of the resistor 57, as illustrated in FIG. 8(A).

The resistor string 47 is electrically connected to the power supply line 71 and the power supply line 72. The potential V1 is supplied to the resistor string 47 through the power supply line 71, and the potential V2 is supplied to the resistor string 47 through the power supply line 72. Note that a structure in which the potential Vrn is not supplied can be employed.

The power supply line 71 is also electrically connected to one terminal of the switch 48, and the power supply line 72 is also electrically connected to one terminal of the switch 49.

The signal generation circuit 61 has a function of generating a digital signal corresponding to an image signal supplied to the pixel 11. The signal generation circuit 61 has a function of generating an 8-bit digital signal, for example.

The converter circuit 62 has a function of converting a digital signal generated by the signal generation circuit 61 such that processing by the DA converter circuit can be performed appropriately. For example, the converter circuit 62 can convert a digital signal generated by the signal generation circuit 61 into a digital signal in which the number of bits of the digital signal is increased by one bit or two bits. In the case where the number of bits of a digital signal generated by the signal generation circuit 61 is 8 bits, for example, the converter circuit 62 can convert the digital signal into a 9-bit or 10-bit digital signal. Note that the converter circuit 62 may have a function of converting the digital signal generated by the signal generation circuit 61 into a digital signal in which the number of bits is increased by three bits or more. The converter circuit 62 may have a function of performing image processing such as γ correction on a digital signal generated by the signal generation circuit 61.

A digital signal output from the converter circuit 62 is input to the latch circuit 42 through the data bus wiring 51. The latch circuit 42 has a function of performing one of retention operation of the digital signal and output operation of the retained digital signal in response to a signal supplied from the shift register 41.

The level shift circuit 43 has a function of converting an input signal into an output signal with a higher amplitude voltage or a lower amplitude voltage. Specifically, the level shift circuit 43 has a function of converting the amplitude voltage of a digital signal supplied from the latch circuit 42 into an amplitude voltage at which the DA converter circuit operates appropriately.

Figure 8B:
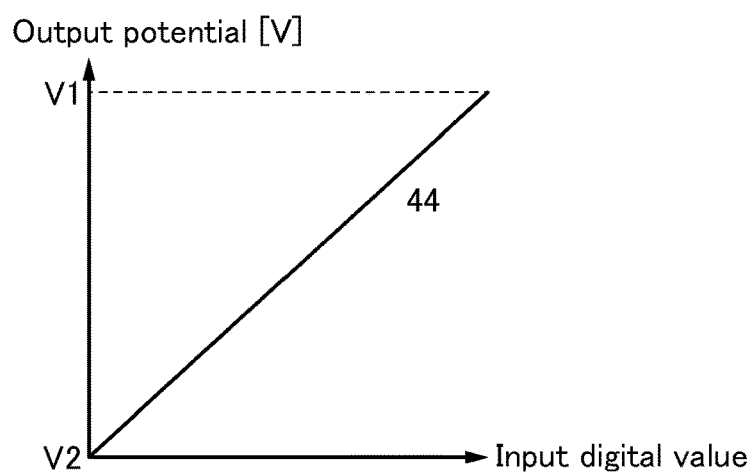

The PTL44 has a function of outputting, as an analog signal, a potential higher than or equal to the potential V2 and lower than or equal to the potential V1 on the basis of a digital value of an input digital signal. FIG. 8(B) is a graph showing the relationship between an output potential and an input digital value in the PTL44. As shown in FIG. 8(B), in the PTL 44, the larger the digital value of the input digital signal is, the higher the output potential is. For example, assuming that a 9-bit digital signal is input to the PTL44, the PTL44 can output the potential V2 in the case where the digital value of the digital signal is 0 in decimal notation, and the PTL 44 can output the potential V1 in the case where the digital value is 511 in decimal notation. Note that in the PTL 44, as the digital value of the input digital signal is larger, the output potential may be lower. For example, assuming that a 9-bit digital signal is input to the PTL44, the PTL44 may output the potential V1 in the case where the digital value of the digital signal is 0 in decimal notation, and the PTL44 may output the potential V2 in the case where the digital value is 511 in decimal notation.

Here, when the number of bits of the digital signal input to the PTL44 is b, t can be denoted by "$2^b-1$". That is, in the case where the digital signal is a 9-bit signal, for example, the resistor string 47 can have a structure including 511 resistors 57. It is preferable that the resistance values of the resistors 57 [1] to 57[t] be equal to each other such that the relationship between the potential output from the PTL44 and the digital value of the digital signal input to the PTL44 becomes linear.

A digital signal in which the number of bits is converted by the conversion circuit 62 is input to the PTL44, whereby the converter circuit 62 can have a function of inverting the polarity of a potential output from the PTL44.

For example, the source driver circuit 13 operates in a first mode or a second mode. In the first mode, a potential of one terminal of each of the resistor 57[1] to the resistor 57[(t+1)/2)] is output from the PTL44, and in the second mode, a potential of one terminal of each of the resistor 57[(t+1)/2+1] to the resistor 57[t] or a potential of the other terminal of the resistor 57[t] is output from the PTL44. In that case, by switching from the first mode to the second mode, the polarity of the potential output from the PTL44 can be inverted.

Here, the converter circuit 62 can convert a digital signal generated by the signal generation circuit 61 such that the most significant bit of a digital signal output to the PTL44 denotes the operation mode of the source driver circuit 13. For example, in the case where the source driver circuit 13 operates in the first mode, a bit of the value "1" may be added to the most significant bit of a digital signal generated by the signal generation circuit 61, and the converter circuit 62 may perform output to the data bus wiring 51. In the case where the source driver circuit 13 operates in the second mode, a bit of the value "0" may be added to the most significant bit of a digital signal generated by the signal generation circuit 61, and the converter circuit 62 may perform output to the data bus wiring 51.

The amplifier circuit 46 has a function of amplifying an analog signal input to the input terminal and outputting the amplified signal to the output terminal. Providing the amplifier circuit 46 allows an image signal to be supplied to the pixel 11 stably. The amplifier circuit 46 can have a structure similar to that of the amplifier circuit 46a or the amplifier circuit 46b.

The control signal EN is supplied to the switch 48, and the on/off of the switch 48 is controlled by the control signal EN. The control signal ENB is supplied to the switch 49, and the on/off of the switch 49 is controlled by the control signal ENB.

When the value of the control signal EN is "1" and the value of the control signal ENB is "0", the switch 48 is turned on and the switch 49 is turned off. Thus, the potential of the wiring 32 [j] becomes the potential V1. On the other hand, when the value of the control signal EN is "0" and the value of the control signal ENB is "1", the switch 49 is turned on and the switch 48 is turned off. Thus, the potential of the wiring 32 [j] becomes the potential V2. In this manner, by switching the values of the control signal EN and the control signal ENB, the potentials supplied to the wiring 32 can be switched. Since the potential V2 is a potential obtained by inverting the polarity of the potential V1, the values of the control signal EN and the control signal ENB are switched, whereby the polarities of the potentials supplied to the wiring 32 can be inverted.

In the source driver circuit 13 having the structure illustrated in FIG. 8(A), frame inversion driving can be performed by switching the operation mode of the source driver circuit 13 and switching the values of the control signal EN and the control signal ENB.

Note that the source driver circuit 13 can have a structure including n shift registers 41, n latch circuits 42, n level shift circuits 43, n PTL44, n amplifier circuits 46, n resistor strings 47, n switches 48, and n switches 49. Moreover, for example, a structure in which one control signal EN is supplied to all the switches 48 can be employed, and a structure in which one control signal ENB is supplied to all the switches 49 can be employed.

In the case where the source driver circuit 13 included in the display device 10 has the structure illustrated in FIG. 8(A), the type of the PTL provided in the source driver circuit 13 can be one. Thus, the manufacturing process of the display device 10 can be simplified.

1-7. Structure Example 2 of Display Device

Figure 9:
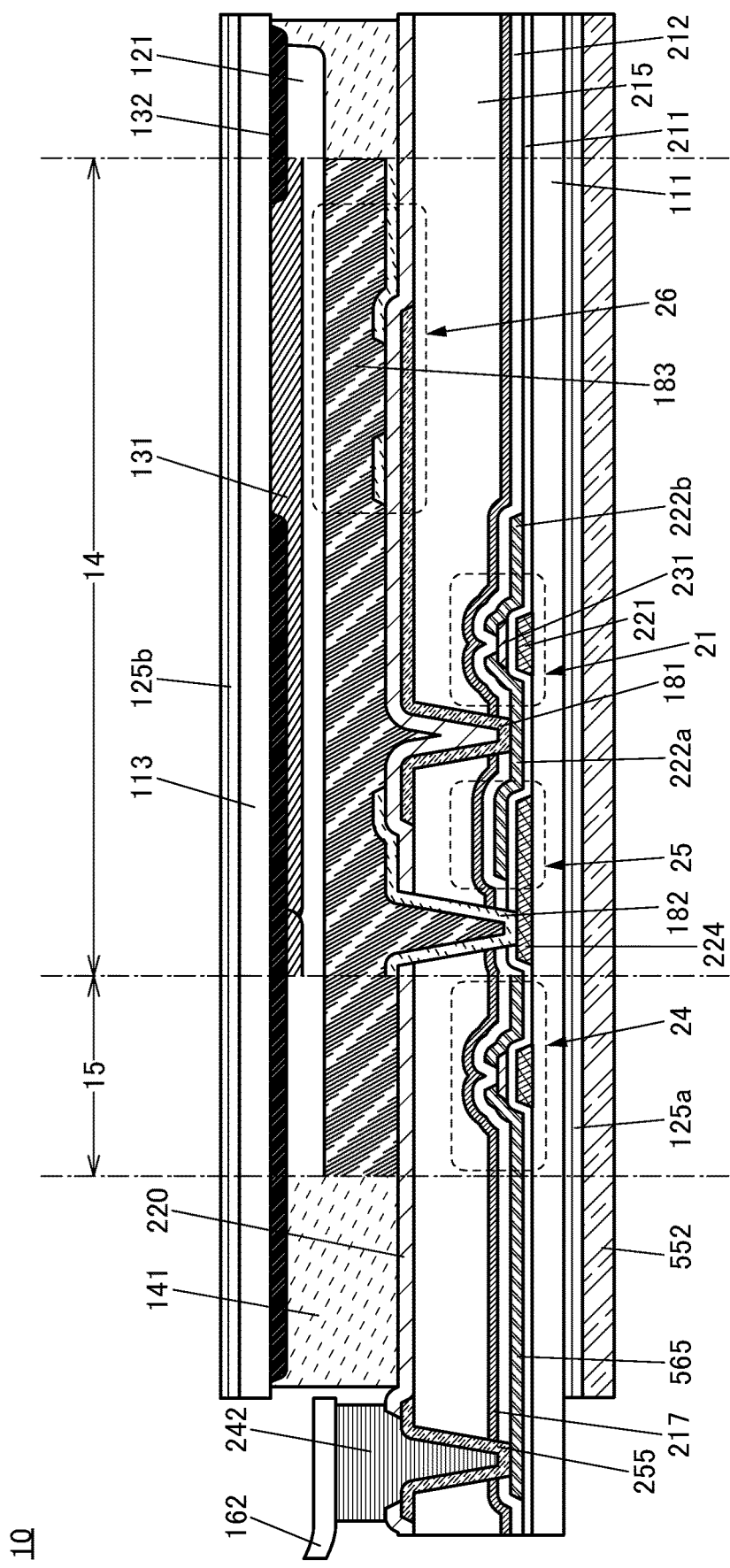
FIG. 9 A diagram illustrating an example of a display device.

FIG. 9 is a cross-sectional view illustrating a structure example of the display device 10 and illustrates the case where the display device 10 is a transmissive liquid crystal display device employing a horizontal electric field mode.

FIG. 9 illustrates structure examples of the pixel array 14 and a circuit 15. The circuit 15 can be used as the gate driver circuit 12, the source driver circuit 13, or the like.

The display device 10 has a structure in which a substrate 111 and a substrate 113 are bonded to each other. In the pixel array 14, the transistor 21, the capacitor 25, the display element 26, and the like are provided over the substrate 111. In the circuit 15, a transistor 24 and the like are provided over the substrate 111. Moreover, a coloring layer 131, a light-blocking layer 132, and the like are provided on the substrate 113.

The transistor 21 includes a conductive layer 221 functioning as a gate electrode, an insulating layer 211 functioning as a gate insulating layer, a semiconductor layer 231, and a conductive layer 222*a* and a conductive layer 222*b* functioning as a source electrode and a drain electrode. The capacitor 25 includes a conductive layer 224 and the conductive layer 222*a* functioning as an electrode and the insulating layer 211 functioning as a dielectric layer. The transistor 21, the transistor 24, and the capacitor 25 are covered by an insulating layer 212 and an insulating layer 217. An insulating layer 215 functioning as an interlayer insulating layer is provided between the transistor 21, the transistor 24, and the capacitor 25 and the display element 26.

The semiconductor layer 231 can contain a metal oxide. In this case, the transistor 21 is an OS transistor. Note that the other transistors provided over the substrate 111, such as the transistor 24, can also have a structure similar to that of the transistor 21.

The display element 26 is liquid crystal element employing a horizontal electric field mode, specifically, an FFS (Fringe Field Switching) mode. The display element 26 includes an electrode 181, an electrode 182, and a liquid crystal layer 183. The alignment of the liquid crystal layer 183 can be controlled with the electrical field generated between the electrode 181 and the electrode 182. The liquid crystal layer 183 is positioned over an insulating layer 220 and the electrode 182. The electrode 181 is electrically connected to the conductive layer 222*a* through an opening provided in the insulating layer 215, the insulating layer 217, and the insulating layer 212. The electrode 182 is electrically connected to the conductive layer 224 through an opening provided in the insulating layer 215, the insulating layer 217, the insulating layer 212, and the insulating layer 211. Note that the electrode 182 may have a top-surface shape (also referred to as a planar shape) that has a comb-like shape or a top-surface shape that is provided with a slit. One or more openings can be provided in the electrode 182.

The insulating layer 220 is provided between the electrode 181 and the electrode 182. The electrode 181 includes a portion that overlaps with the electrode 182 with the insulating layer 220 therebetween. Furthermore, a portion that is not provided with the electrode 182 over the electrode 181 is included in a region where the electrode 181 and the coloring layer 131 overlap with each other.

Light from a backlight unit 552 is emitted to the outside of the display device through the substrate 111, the electrode 181, the electrode 182, the liquid crystal layer 183, the coloring layer 131, and the substrate 113. As materials of these layers that transmit the light from the backlight unit 552, visible-light-transmitting materials are used.

An overcoat 121 is preferably provided between the liquid crystal layer 183 and each of the coloring layer 131 and the light-blocking layer 132. The overcoat 121 can inhibit the diffusion of impurities contained in the coloring layer 131, the light-blocking layer 132, and the like to the liquid crystal layer 183.

The substrate 111 and the substrate 113 are attached to each other with a bonding layer 141. The liquid crystal layer 183 is encapsulated in a region that is surrounded by the substrate 111, the substrate 113, and the bonding layer 141.

A polarizing plate 125*a* and a polarizing plate 125*b* are provided with the pixel array 14, the circuit 15, and the like of the display device positioned therebetween. Light from the backlight unit 552 provided outside the polarizing plate 125*a* enters the display device 10 through the polarizing plate 125*a*. In this case, the optical modulation of the light can be controlled by controlling the alignment of the liquid crystal layer 183 with a voltage supplied between the electrode 181 and the electrode 182. In other words, the intensity of light emitted from the display device 10 through the polarizing plate 125*b* can be controlled. Furthermore, the coloring layer 131 absorbs light of wavelengths other than a specific wavelength range from light entering the display element 26, and thus light emitted from the display device 10 is light that exhibits red, blue, or green colors, for example.

A conductive layer 565 is electrically connected to an FPC 162 through a conductive layer 255 and a connector 242.

When a liquid crystal element employing a horizontal electric field mode is used as the display element 26, both of the electrode 181 that is one electrode of the display element 26 and the electrode 182 that is the other electrode of the display element 26 can be formed on one surface of the liquid crystal layer 183. Thus, both of the electrode 181 and the electrode 182 can be electrically connected to an electrode of the capacitor 25.

As the liquid crystal used in the liquid crystal element, a liquid crystal exhibiting a blue phase can be used. In this case, a high voltage is preferably applied to the display element 26. In the display device 10, a high voltage can be applied to the display element 26, so that the display device 10 can be operated normally even when a liquid crystal exhibiting a blue phase is used in the display element 26.

The blue phase is one of the liquid crystal phases, which appears just before a cholesteric phase changes into an isotropic phase when the temperature of a cholesteric liquid crystal is increased. Since the blue phase appears only in a narrow temperature range, a liquid crystal composition in which a chiral material is mixed to account for several weight percent or more is used for the liquid crystal in order to improve the temperature range. The liquid crystal composition containing a liquid crystal exhibiting a blue phase and a chiral material has a short response time and optical isotropy. In addition, the liquid crystal composition containing a liquid crystal exhibiting a blue phase and a chiral material does not need alignment treatment and has small viewing angle dependence. In addition, an alignment film does not need to be provided and rubbing treatment is thus not necessary; accordingly, electrostatic discharge damage caused by the rubbing treatment can be prevented and defects and damage of the liquid crystal display device in the manufacturing process can be reduced.

Note that a liquid crystal other than a liquid crystal exhibiting a blue phase may be used as a liquid crystal used for the liquid crystal element. For example, a thermotropic liquid crystal, a low-molecular liquid crystal, a high-molecular liquid crystal, a polymer dispersed liquid crystal (PDLC), a ferroelectric liquid crystal, an anti-ferroelectric liquid crystal, or the like can be used. Such a liquid crystal material exhibits a cholesteric phase, a smectic phase, a cubic phase, a chiral nematic phase, an isotropic phase, or the like depending on conditions. As the liquid crystal material, either a positive liquid crystal or a negative liquid crystal may be used. Note that in the case where a liquid crystal other than a blue phase is used as a liquid crystal used in a liquid crystal element, an alignment film is preferably provided in order to control the alignment of liquid crystals.

This embodiment can be implemented in appropriate combination with any of the structures described in the other embodiments and the like.

Embodiment 2

In this embodiment, examples of a transistor that can be replaced with each transistor described in the above embodiment will be described with reference to drawings.

The display device of one embodiment of the present invention can be manufactured using a transistor with various modes, such as a bottom-gate transistor or a top-gate transistor. Therefore, a material used for a semiconductor layer or a transistor structure can be easily changed depending on the existing manufacturing line.

[Bottom-Gate Transistor]

FIG. 10(A1) is a cross-sectional view in the channel length direction of a channel protective transistor 810 that is a kind of bottom-gate transistor. In FIG. 10(A1), the transistor 810 is formed over a substrate 771. In addition, the transistor 810 includes an electrode 746 over the substrate 771 with an insulating layer 772 therebetween. The transistor 810 further includes a semiconductor layer 742 over the electrode 746 with an insulating layer 726 therebetween. The electrode 746 can function as a gate electrode. The insulating layer 726 can function as a gate insulating layer.

The transistor 810 further includes an insulating layer 741 over a channel formation region in the semiconductor layer 742. The transistor 810 further includes an electrode 744a and an electrode 744b that are partly in contact with the semiconductor layer 742 and are over the insulating layer 726. The electrode 744a can function as one of a source electrode and a drain electrode. The electrode 744b can function as the other of the source electrode and the drain electrode. Part of the electrode 744a and part of the electrode 744b are formed over the insulating layer 741.

The insulating layer 741 can function as a channel protective layer. With the insulating layer 741 provided over the channel formation region, the semiconductor layer 742 can be prevented from being exposed at the time of forming the electrode 744a and the electrode 744b. Thus, the channel formation region in the semiconductor layer 742 can be prevented from being etched at the time of forming the electrode 744a and the electrode 744b. According to one embodiment of the present invention, a transistor with favorable electrical characteristics can be achieved.

Furthermore, the transistor 810 includes an insulating layer 728 over the electrode 744a, the electrode 744b, and the insulating layer 741 and includes an insulating layer 729 over the insulating layer 728.

In the case where an oxide semiconductor is used for the semiconductor layer 742, a material capable of removing oxygen from part of the semiconductor layer 742 to generate oxygen vacancies is preferably used at least for portions of the electrode 744a and the electrode 744b that are in contact with the semiconductor layer 742. The carrier concentration in regions of the semiconductor layer 742 where oxygen vacancies are generated is increased, so that the regions become n-type regions ($n^+$ layers). Accordingly, the regions can function as a source region and a drain region. When an oxide semiconductor is used for the semiconductor layer 742, examples of the material capable of removing oxygen from the semiconductor layer 742 to generate oxygen vacancies include tungsten and titanium.

Formation of the source region and the drain region in the semiconductor layer 742 makes it possible to reduce contact resistance between the semiconductor layer 742 and each of the electrode 744a and the electrode 744b. Accordingly, the electrical characteristics of the transistor, such as the field-effect mobility and the threshold voltage, can be improved.

In the case where a semiconductor such as silicon is used for the semiconductor layer 742, a layer that functions as an n-type semiconductor or a p-type semiconductor is preferably provided between the semiconductor layer 742 and the electrode 744a and between the semiconductor layer 742 and the electrode 744b. The layer that functions as an n-type semiconductor or a p-type semiconductor can function as a source region or a drain region of the transistor.

The insulating layer 729 is preferably formed using a material that has a function of preventing or reducing diffusion of impurities into the transistor from the outside. Note that the insulating layer 729 can be omitted as necessary.

A transistor 811 illustrated in FIG. 10(A2) is different from the transistor 810 in that an electrode 723 that can function as a back gate electrode is provided over the insulating layer 729. The electrode 723 can be formed using a material and a method similar to those of the electrode 746.

In general, a back gate electrode is formed using a conductive layer and positioned so that a channel formation region of a semiconductor layer is sandwiched between a gate electrode and the back gate electrode. Thus, the back gate electrode can function in a manner similar to that of the gate electrode. The potential of the back gate electrode may be set equal to the potential of the gate electrode, or may be a ground potential (GND potential) or a given potential. Moreover, by changing the potential of the back gate electrode not in synchronization with but independently of that of the gate electrode, the threshold voltage of the transistor can be changed.

The electrode 746 and the electrode 723 can each function as a gate electrode. Thus, the insulating layer 726, the insulating layer 728, and the insulating layer 729 can each function as a gate insulating layer. Note that the electrode 723 may be provided between the insulating layer 728 and the insulating layer 729.

Note that in the case where one of the electrode 746 and the electrode 723 is referred to as a "gate electrode," the other is referred to as a "back gate electrode." For example, in the case where the electrode 723 in the transistor 811 is referred to as a "gate electrode," the electrode 746 is referred to as a "back gate electrode." In addition, in the case where the electrode 723 is used as a "gate electrode," the transistor 811 can be considered as a kind of top-gate transistor. Furthermore, in some cases, one of the electrode 746 and the electrode 723 is referred to as a "first gate electrode," and the other is referred to as a "second gate electrode."

By providing the electrode 746 and the electrode 723 with the semiconductor layer 742 therebetween and setting the potential of the electrode 746 equal to the potential of the electrode 723, a region of the semiconductor layer 742 through which carriers flow is enlarged in the film thickness direction; thus, the number of transferred carriers is increased. As a result, the on-state current of the transistor 811 is increased and the field-effect mobility is increased.

Therefore, the transistor 811 is a transistor having high on-state current for its occupation area. That is, the occupation area of the transistor 811 can be small for required on-state current. According to one embodiment of the present invention, the occupation area of a transistor can be reduced. Therefore, according to one embodiment of the present invention, a semiconductor device having a high degree of integration can be achieved.

In addition, the gate electrode and the back gate electrode are formed using conductive layers and thus each have a function of preventing an electric field generated outside the transistor from influencing a semiconductor layer in which a channel is formed (in particular, an electric field blocking function against static electricity or the like). Note that when the back gate electrode is formed larger than the semiconductor layer such that the semiconductor layer is covered with the back gate electrode, the electric field blocking function can be enhanced.

Furthermore, when the back gate electrode is formed using a light-blocking conductive layer, light can be prevented from entering the semiconductor layer from the back gate electrode side. Therefore, photodegradation of the semiconductor layer can be prevented and deterioration in electrical characteristics of the transistor, such as a shift of the threshold voltage, can be prevented.

According to one embodiment of the present invention, a transistor with high reliability can be achieved. Moreover, a semiconductor device with high reliability can be achieved.

FIG. 10(B1) is a cross-sectional view in the channel length direction of a channel-protective transistor 820, which has a structure different from the structure in FIG. 10(A1). The transistor 820 has substantially the same structure as the transistor 810 but is different from the transistor 810 in that the insulating layer 741 covers end portions of the semiconductor layer 742. In addition, the semiconductor layer 742 is electrically connected to the electrode 744*a* in an opening portion formed by selectively removing part of the insulating layer 741 including a region that overlaps with the semiconductor layer 742. Furthermore, the semiconductor layer 742 is electrically connected to the electrode 744*b* in another opening portion formed by selectively removing part of the insulating layer 741 including the region that overlaps with the semiconductor layer 742. A region of the insulating layer 741 that overlaps with the channel formation region can function as a channel protective layer.

A transistor 821 illustrated in FIG. 10(B2) is different from the transistor 820 in that the electrode 723 that can function as a back gate electrode is provided over the insulating layer 729.

By providing the insulating layer 741, the semiconductor layer 742 can be prevented from being exposed at the time of forming the electrode 744*a* and the electrode 744*b*. Thus, the semiconductor layer 742 can be prevented from being thinned down at the time of forming the electrode 744*a* and the electrode 744*b*.

In addition, the distance between the electrode 744*a* and the electrode 746 and the distance between the electrode 744*b* and the electrode 746 in the transistor 820 and the transistor 821 are larger than those in the transistor 810 and the transistor 811. Thus, parasitic capacitance generated between the electrode 744*a* and the electrode 746 can be reduced. Moreover, parasitic capacitance generated between the electrode 744*b* and the electrode 746 can be reduced. According to one embodiment of the present invention, a transistor with favorable electrical characteristics can be achieved.

FIG. 10(C1) is a cross-sectional view in the channel length direction of a channel-etched transistor 825, which is a kind of bottom-gate transistor. In the transistor 825, the electrode 744*a* and the electrode 744*b* are formed without providing the insulating layer 741. Thus, part of the semiconductor layer 742 that is exposed at the time of forming the electrode 744*a* and the electrode 744*b* is etched in some cases. Meanwhile, since the insulating layer 741 is not provided, the productivity of the transistor can be increased.

A transistor 826 illustrated in FIG. 10(C2) is different from the transistor 825 in that the electrode 723 that can function as a back gate electrode is provided over the insulating layer 729.

FIGS. 11(A1) to 11(C2) illustrate cross-sectional views in the channel width direction of the transistor 810, the transistor 811, the transistor 820, the transistor 821, the transistor 825, and the transistor 826, respectively.

In each of the structures illustrated in FIGS. 11(B2) and 11(C2), the gate electrode is connected to the back gate electrode, and the gate electrode and the back gate electrode have the same potential. In addition, the semiconductor layer 742 is sandwiched between the gate electrode and the back gate electrode.

The length in the channel width direction of each of the gate electrode and the back gate electrode is longer than the length in the channel width direction of the semiconductor layer 742. In the channel width direction, the whole of the semiconductor layer 742 is covered with the gate electrode or the back gate electrode with the insulating layer 726, the insulating layer 741, the insulating layer 728, and the insulating layer 729 sandwiched therebetween.

With the structure, the semiconductor layer 742 included in the transistor can be electrically surrounded by electric fields of the gate electrode and the back gate electrode.

A device structure of a transistor, like that of the transistor 811, the transistor 821 or the transistor 826, in which electric fields of a gate electrode and a back gate electrode electrically surround the semiconductor layer 742 where a channel formation region is formed can be referred to as a Surrounded channel (S-channel) structure.

With the S-channel structure, an electric field for inducing a channel can be effectively applied to the semiconductor layer 742 by one or both of the gate electrode and the back gate electrode, which enables improvement in the current drive capability of the transistor and high on-state current characteristics. In addition, since the on-state current can be increased, it is possible to scale down the transistor. Furthermore, with the S-channel structure, the mechanical strength of the transistor can be increased.

[Top-Gate Transistor]

A transistor 842 illustrated as an example in FIG. 12(A1) is a kind of top-gate transistor. As for the transistor 842, after the insulating layer 729 is formed, the electrode 744*a* and the electrode 744*b* are formed. The electrode 744*a* and the electrode 744*b* are electrically connected to the semiconductor layer 742 in opening portions formed in the insulating layer 728 and the insulating layer 729.

In addition, part of the insulating layer 726 that does not overlap with the electrode 746 is removed, and an impurity is introduced into the semiconductor layer 742 using the electrode 746 and the remaining part of the insulating layer 726 as a mask, so that an impurity region can be formed in the semiconductor layer 742 in a self-aligned manner. The transistor 842 includes a region where the insulating layer 726 extends beyond end portions of the electrode 746. The semiconductor layer 742 in a region into which the impurity is introduced through the insulating layer 726 has a lower impurity concentration than a region into which the impurity is introduced without through the insulating layer 726. Thus, an LDD (Lightly Doped Drain) region is formed in a region of the semiconductor layer 742 that does not overlap with the electrode 746.

A transistor 843 illustrated in FIG. 12(A2) is different from the transistor 842 in that the electrode 723 is included. The transistor 843 includes the electrode 723 formed over the substrate 771. The electrode 723 has a region overlapping with the semiconductor layer 742 with the insulating layer 772 therebetween. The electrode 723 can function as a back gate electrode.

In addition, as in a transistor 844 illustrated in FIG. 12(B1) and a transistor 845 illustrated in FIG. 12(B2), the insulating layer 726 in a region that does not overlap with the electrode 746 may be completely removed. Furthermore, as in a transistor 846 illustrated in FIG. 12(C1) and a transistor 847 illustrated in FIG. 12(C2), the insulating layer 726 may be left.

Also in the transistor 842 to the transistor 847, the impurity is introduced into the semiconductor layer 742 using the electrode 746 as a mask after the formation of the electrode 746, so that an impurity region can be formed in the semiconductor layer 742 in a self-aligned manner. According to one embodiment of the present invention, a transistor with favorable electrical characteristics can be achieved. Furthermore, according to one embodiment of the present invention, a semiconductor device having a high degree of integration can be achieved.

FIGS. 13(A1) to 13(C2) illustrate cross-sectional views in the channel width direction of the transistor 842 to the transistor 847, respectively.

The transistor 843, the transistor 845, and the transistor 847 each have the above-described S-channel structure; however, one embodiment of the present invention is not limited to this, and the transistor 843, the transistor 845, and the transistor 847 do not necessarily have the S-channel structure.

This embodiment can be implemented in an appropriate combination with the structures described in the other embodiments and the like.

Embodiment 3

In this embodiment, a specific structure example of an OS transistor will be described.

A semiconductor layer included in an OS transistor can be, for example, a film represented by an In-M-Zn-based oxide that contains indium, zinc, and M (a metal such as aluminum, titanium, gallium, germanium, yttrium, zirconium, lanthanum, cerium, tin, neodymium, or hafnium).

In the case where an oxide semiconductor that constitutes the semiconductor layer is an In-M-Zn-based oxide, it is preferable that the atomic ratio of metal elements in a sputtering target used to deposit an In-M-Zn oxide satisfy In≥M and Zn≥M. The atomic ratio of metal elements of such a sputtering target is preferably In:M:Zn=1:1:1, In:M:Zn=1:1.2, In:M:Zn=3:1:2, In:M:Zn=4:2:3, In:M:Zn=4:2:4.1, In:M:Zn=5:1:6, In:M:Zn=5:1:7, In:M:Zn=5:1:8, or the like. Note that the atomic ratio in the deposited semiconductor layer varies from the atomic ratio of metal elements in the sputtering targets in a range of ±40%.

An oxide semiconductor with low carrier density is used for the semiconductor layer. For example, for the semiconductor layer, an oxide semiconductor whose carrier density is lower than or equal to $1\times10^{17}/cm^3$, preferably lower than or equal to $1\times10^{15}/cm^3$, further preferably lower than or equal to $1\times10^{13}/cm^3$, still further preferably lower than or equal to $1\times10^{11}/cm^3$, even further preferably lower than $1\times10^{10}/cm^3$, and higher than or equal to $1\times10^{-9}/cm^3$ can be used. Such an oxide semiconductor is referred to as a highly purified intrinsic or substantially highly purified intrinsic oxide semiconductor. The oxide semiconductor has low density of defect states and can be regarded as an oxide semiconductor having stable characteristics.

Note that the composition is not limited to those, and a material having appropriate composition may be used depending on required semiconductor characteristics and electrical characteristics of the transistor (field-effect mobility, threshold voltage, or the like). In addition, to obtain the required semiconductor characteristics of the transistor, it is preferable that the carrier density, impurity concentration, defect density, atomic ratio between a metal element and oxygen, interatomic distance, density, and the like of the semiconductor layer be set to be appropriate.

When silicon or carbon, which is one of the Group 14 elements, is contained in the oxide semiconductor that constitutes the semiconductor layer, oxygen vacancies are increased, and the semiconductor layer becomes n-type. Thus, the concentration (concentration obtained by secondary ion mass spectrometry) of silicon or carbon in the semiconductor layer is set to lower than or equal to $2\times10^{18}$ atoms/$cm^3$, preferably lower than or equal to $2\times10^{17}$ atoms/$cm^3$.

In addition, alkali metal and alkaline earth metal might generate carriers when bonded to an oxide semiconductor, in which case the off-state current of the transistor might be increased. Thus, the concentration (concentration obtained by secondary ion mass spectrometry) of alkali metal or alkaline earth metal in the semiconductor layer is set to lower than or equal to $1\times10^{18}$ atoms/$cm^3$, preferably lower than or equal to $2\times10^{16}$ atoms/$cm^3$.

Furthermore, when nitrogen is contained in the oxide semiconductor that constitutes the semiconductor layer, electrons serving as carriers are generated and the carrier density is increased, so that the semiconductor layer easily becomes n-type. As a result, a transistor using an oxide semiconductor that contains nitrogen is likely to have normally-on characteristics. Therefore, the concentration (concentration obtained by secondary ion mass spectrometry) of nitrogen in the semiconductor layer is preferably set to lower than or equal to $5\times10^{18}$ atoms/$cm^3$.

Moreover, the semiconductor layer may have a non-single-crystal structure, for example. The non-single-crystal structure includes, for example, a CAAC-OS (C Axis Aligned Crystalline Oxide Semiconductor) including a c-axis aligned crystal, a polycrystalline structure, a microcrystalline structure, or an amorphous structure. Among the non-single-crystal structures, the amorphous structure has the highest density of defect states, whereas the CAAC-OS has the lowest density of defect states.

An oxide semiconductor film having an amorphous structure has disordered atomic arrangement and no crystalline component, for example. Moreover, an oxide film having an amorphous structure has a completely amorphous structure and no crystal part, for example.

Note that the semiconductor layer may be a mixed film including two or more kinds selected from a region having an amorphous structure, a region having a microcrystalline structure, a region having a polycrystalline structure, a CAAC-OS region, and a region having a single crystal structure. The mixed film has, for example, a single-layer structure or a stacked-layer structure including two or more kinds of regions selected from the above regions in some cases.

The composition of a CAC (Cloud-Aligned Composite)-OS, which is one embodiment of a non-single-crystal semiconductor layer, is described below.

The CAC-OS is, for example, a composition of a material in which elements that constitute an oxide semiconductor are unevenly distributed to have a size of greater than or equal to 0.5 nm and less than or equal to 10 nm, preferably greater than or equal to 1 nm and less than or equal to 2 nm, or a similar size. Note that in the following description, a state in which one or more metal elements are unevenly distributed and regions including the metal element(s) are mixed to have a size of greater than or equal to 0.5 nm and less than or equal to 10 nm, preferably greater than or equal to 1 nm and less than or equal to 2 nm, or a similar size in an oxide semiconductor is referred to as a mosaic pattern or a patch-like pattern.

Note that the oxide semiconductor preferably contains at least indium. In particular, indium and zinc are preferably contained. Moreover, in addition to these, one kind or a plurality of kinds selected from aluminum, gallium, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like may be contained.

For example, a CAC-OS in an In—Ga—Zn oxide (an In—Ga—Zn oxide in the CAC-OS may be particularly referred to as CAC-IGZO) has a composition in which materials are separated into indium oxide (hereinafter referred to as $InO_{X1}$ (X1 is a real number greater than 0)) or indium zinc oxide (hereinafter referred to as $In_{X2}Zn_{Y2}O_{Z2}$ (each of X2, Y2, and Z2 is a real number greater than 0)) and gallium oxide (hereinafter referred to as $GaO_{X3}$ (X3 is a real number greater than 0)), gallium zinc oxide (hereinafter referred to as $Ga_{X4}Zn_{Y4}O_{Z4}$ (each of X4, Y4, and Z4 is a real number greater than 0)), or the like so that a mosaic pattern is formed, and mosaic-like $InO_{X1}$ or $In_{X2}Zn_{Y2}O_{Z2}$ is evenly distributed in the film (this composition is hereinafter also referred to as a cloud-like composition).

That is, the CAC-OS is a composite oxide semiconductor having a composition in which a region where $GaO_{X3}$ is a main component and a region where $In_{X2}Zn_{Y2}O_{Z2}$ or $InO_{X1}$ is a main component are mixed. Note that in this specification, for example, when the atomic ratio of In to an element M in a first region is larger than the atomic ratio of In to the element M in a second region, the first region is regarded as having a higher In concentration than the second region.

Note that IGZO is a commonly known name and sometimes refers to one compound formed of In, Ga, Zn, and O. A typical example is a crystalline compound represented by $InGaO_3(ZnO)_{m1}$ (m1 is a natural number) or $In_{(1+x0)}Ga_{(1-x0)}O_3(ZnO)_{m0}$ ($-1 \leq x0 \leq 1$; m0 is a given number).

The crystalline compound has a single crystal structure, a polycrystalline structure, or a CAAC structure. Note that the CAAC structure is a crystal structure in which a plurality of IGZO nanocrystals have c-axis alignment and are connected in an a-b plane without alignment.

Meanwhile, the CAC-OS relates to the material composition of an oxide semiconductor. In the material composition of a CAC-OS containing In, Ga, Zn, and O, some regions that contain Ga as a main component and are observed as nanoparticles and some regions that contain In as a main component and are observed as nanoparticles are each randomly dispersed in a mosaic pattern. Therefore, the crystal structure is a secondary element for the CAC-OS.

Note that the CAC-OS is regarded as not including a stacked-layer structure of two or more kinds of films with different compositions. For example, a two-layer structure of a film containing In as a main component and a film containing Ga as a main component is not included.

Note that a clear boundary between the region where $GaO_{X3}$ is a main component and the region where $In_{X2}Zn_{Y2}O_{Z2}$ or $InO_{X1}$ is a main component cannot be observed in some cases.

Note that in the case where one kind or a plurality of kinds selected from aluminum, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like are contained instead of gallium, the CAC-OS refers to a composition in which some regions that contain the metal element(s) as a main component and are observed as nanoparticles and some regions that contain In as a main component and are observed as nanoparticles are each randomly dispersed in a mosaic pattern.

The CAC-OS can be formed by a sputtering method under a condition where a substrate is not heated intentionally, for example. In addition, in the case of forming the CAC-OS by a sputtering method, one or more selected from an inert gas (typically, argon), an oxygen gas, and a nitrogen gas may be used as a deposition gas. Furthermore, the ratio of the flow rate of an oxygen gas to the total flow rate of the deposition gas at the time of deposition is preferably as low as possible, and for example, the ratio of the flow rate of the oxygen gas is preferably higher than or equal to 0% and lower than 30%, further preferably higher than or equal to 0% and lower than or equal to 10%.

The CAC-OS is characterized in that no clear peak is observed at the time of measurement using θ/2θ scan by an Out-of-plane method, which is one of the X-ray diffraction (XRD) measurement methods. That is, it is found from X-ray diffraction measurement that no alignment in an a-b plane direction and a c-axis direction is observed in a measured region.

In addition, in an electron diffraction pattern of the CAC-OS that is obtained by irradiation with an electron beam with a probe diameter of 1 nm (also referred to as a nanobeam electron beam), a ring-like high-luminance region and a plurality of bright spots in the ring region are observed. It is therefore found from the electron diffraction pattern that the crystal structure of the CAC-OS includes an nc (nanocrystal) structure with no alignment in a plan-view direction and a cross-sectional direction.

Moreover, for example, it can be confirmed by EDX mapping obtained using energy dispersive X-ray spectroscopy (EDX) that the CAC-OS in the In—Ga—Zn oxide has a composition in which regions where $GaO_{X3}$ is a main component and regions where $In_{X2}Zn_{Y2}O_{Z2}$ or $InO_{X1}$ is a main component are unevenly distributed and mixed.

The CAC-OS has a composition different from that of an IGZO compound in which metal elements are evenly distributed, and has characteristics different from those of the IGZO compound. That is, the CAC-OS has a composition in which regions where $GaO_{X3}$ or the like is a main component and regions where $In_{X2}Zn_{Y2}O_{Z2}$ or $InO_{X1}$ is a main component are phase-separated from each other, and the regions including the respective elements as the main components form a mosaic pattern.

Here, a region where $In_{X2}Zn_{Y2}O_{Z2}$ or $InO_{X1}$ is a main component is a region whose conductivity is higher than that of a region where $GaO_{X3}$ or the like is a main component. In other words, when carriers flow through regions where $In_{X2}Zn_{Y2}O_{Z2}$ or $InO_{X1}$ is a main component, the conductivity of an oxide semiconductor is exhibited. Accordingly, when the regions where $In_{X2}Zn_{Y2}O_{Z2}$ or $InO_{X1}$ is a main component are distributed like a cloud in an oxide semiconductor, high field-effect mobility ($\mu$) can be achieved.

In contrast, a region where $GaO_{X3}$ or the like is a main component is a region whose insulating property is higher than that of a region where $In_{X2}Zn_{Y2}O_{Z2}$ or $InO_{X1}$ is a main component. In other words, when regions where $GaO_{X3}$ or the like is a main component are distributed in an oxide semiconductor, leakage current can be suppressed and favorable switching operation can be achieved.

Accordingly, when the CAC-OS is used for a semiconductor element, the insulating property derived from $GaO_{X3}$ or the like and the conductivity derived from $In_{X2}Zn_{Y2}O_{Z2}$ or $InO_{X1}$ complement each other, so that high on-state current ($I_{on}$) and high field-effect mobility ($\mu$) can be achieved.

Moreover, a semiconductor element using the CAC-OS has high reliability. Thus, the CAC-OS is suitable for a constituent material in a variety of semiconductor devices.

This embodiment can be implemented in an appropriate combination with the structures described in the other embodiments and the like.

Embodiment 4

In this embodiment, electronic devices of embodiments of the present invention will be described with reference to FIG. 14.

An electronic device in this embodiment is provided with the display device of one embodiment of the present invention. Thus, the display quality of an image displayed on a display portion of the electronic device can be improved.

The display portion of the electronic device in this embodiment can display an image with a resolution of, for example, full high definition, 2K, 4K, 8K, 16K, or higher. In addition, as a screen size of the display portion, the diagonal size can be greater than or equal to 20 inches, greater than or equal to 30 inches, greater than or equal to 50 inches, greater than or equal to 60 inches, or greater than or equal to 70 inches.

Examples of the electronic device include a digital camera, a digital video camera, a digital photo frame, a mobile phone, a portable game console, a portable information terminal, and an audio reproducing device in addition to electronic devices provided with a comparatively large screen, such as a television device, a desktop or laptop personal computer, a monitor for a computer and the like, digital signage, and a large game machine such as a pachinko machine.

The electronic device of one embodiment of the present invention may include an antenna. When a signal is received by the antenna, the electronic device can display an image, data, or the like on the display portion. When the electronic device includes the antenna and a secondary battery, the antenna may be used for contactless power transmission.

The electronic device of one embodiment of the present invention may include a sensor (a sensor having a function of measuring force, displacement, position, speed, acceleration, angular velocity, rotational frequency, distance, light, liquid, magnetism, temperature, a chemical substance, sound, time, hardness, electric field, current, voltage, electric power, radioactive rays, flow rate, humidity, gradient, oscillation, a smell, or infrared rays).

The electronic device of one embodiment of the present invention can have a variety of functions. For example, the electronic device can have a function of displaying a variety of data (a still image, a moving image, a text image, and the like) on the display portion, a touch panel function, a function of displaying a calendar, date, time, and the like, a function of executing a variety of software (programs), a wireless communication function, and a function of reading out a program or data stored in a recording medium.

Figure 14A:
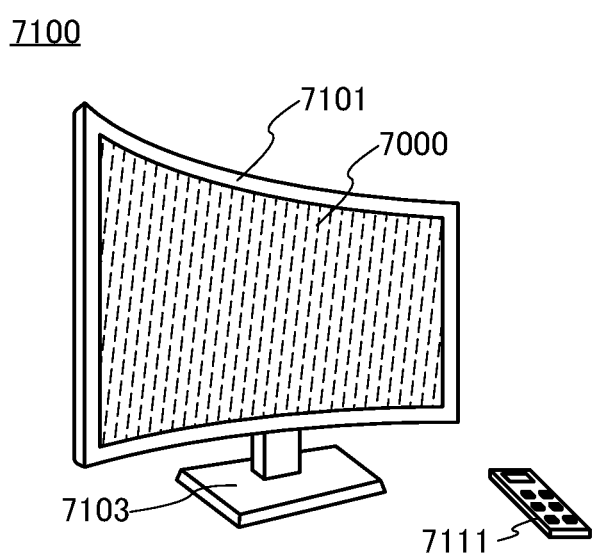
FIGS. 14A to 14D Diagrams illustrating examples of an electronic device.

FIG. 14(A) illustrates an example of a television device. In a television device 7100, a display portion 7000 is incorporated in a housing 7101. Here, a structure in which the housing 7101 is supported by a stand 7103 is illustrated.

The display device of one embodiment of the present invention can be used for the display portion 7000.

Operation of the television device 7100 illustrated in FIG. 14(A) can be performed with an operation switch provided in the housing 7101 or a separate remote controller 7111.

Alternatively, the display portion 7000 may include a touch sensor, and the television device 7100 may be operated by touch on the display portion 7000 with a finger or the like. The remote controller 7111 may be provided with a display portion for displaying data output from the remote controller 7111. With operation keys or a touch panel provided in the remote controller 7111, channels and volume can be operated and images displayed on the display portion 7000 can be operated.

Note that the television device 7100 has a structure in which a receiver, a modem, and the like are provided. A general television broadcast can be received with the receiver. When the television device is connected to a communication network with or without wires via the modem, one-way (from a transmitter to a receiver) or two-way (between a transmitter and a receiver or between receivers, for example) data communication can be performed.

Figure 14B:
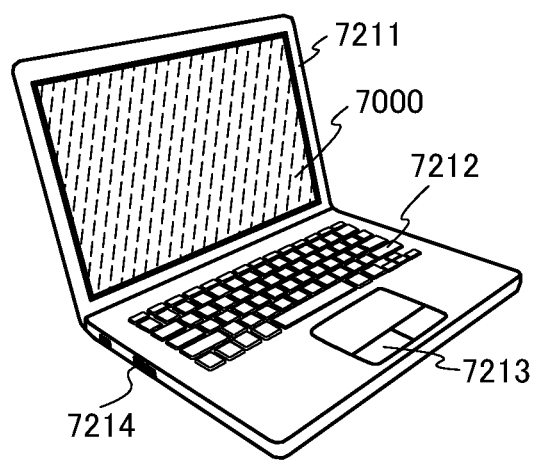

FIG. 14(B) illustrates an example of a laptop personal computer. A laptop personal computer 7200 includes a housing 7211, a keyboard 7212, a pointing device 7213, an external connection port 7214, and the like. In the housing 7211, the display portion 7000 is incorporated.

The display device of one embodiment of the present invention can be used for the display portion 7000.

Figure 14C:
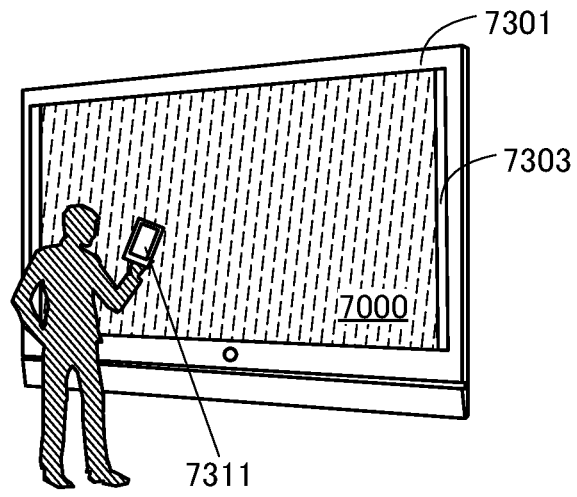
Figure 14D:
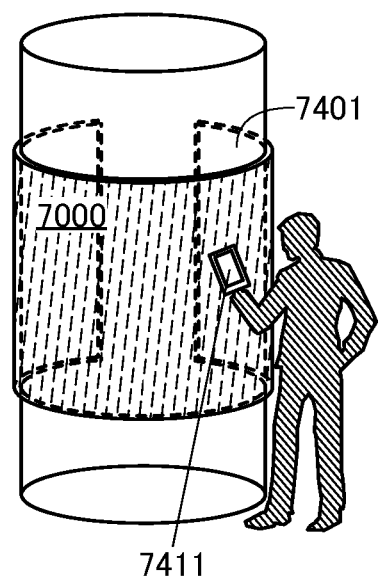

FIGS. 14(C) and 14(D) illustrate examples of digital signage.

Digital signage 7300 illustrated in FIG. 14(C) includes a housing 7301, the display portion 7000, a speaker 7303, and the like. Furthermore, the digital signage can include an LED lamp, operation keys (including a power switch or an operation switch), a connection terminal, a variety of sensors, a microphone, and the like.

FIG. 14(D) is digital signage 7400 attached to a cylindrical pillar 7401. The digital signage 7400 includes the display portion 7000 provided along a curved surface of the pillar 7401.

The display device of one embodiment of the present invention can be used for the display portion 7000 in FIGS. 14(C) and 14(D).

A larger area of the display portion 7000 can provide more data at a time. The larger display portion 7000 attracts more attention, so that the effectiveness of the advertisement can be increased, for example.

The use of a touch panel in the display portion 7000 is preferable because in addition to display of a still image or a moving image on the display portion 7000, intuitive operation by a user is possible. Moreover, for an application for providing information such as route information or traffic information, usability can be enhanced by intuitive operation.

Furthermore, as illustrated in FIGS. 14(C) and 14(D), it is preferable that the digital signage 7300 or the digital signage 7400 work with an information terminal 7311 or an information terminal 7411 such as a user's smartphone through wireless communication. For example, information of an advertisement displayed on the display portion 7000 can be displayed on a screen of the information terminal 7311 or the information terminal 7411. By operation of the information terminal 7311 or the information terminal 7411, display on the display portion 7000 can be switched.

It is possible to make the digital signage 7300 or the digital signage 7400 execute a game with the use of the screen of the information terminal 7311 or the information terminal 7411 as an operation means (controller). Thus, an unspecified number of users can join in and enjoy the game concurrently.

The display device of one embodiment of the present invention can be incorporated along a curved inside/outside wall surface of a house or a building or a curved interior/exterior surface of a vehicle.

This embodiment can be implemented in combination with the structures described in the other embodiments and the like as appropriate.

Example 1

In this example, results of simulation of the display device of one embodiment of the present invention will be described.

Figure 15:
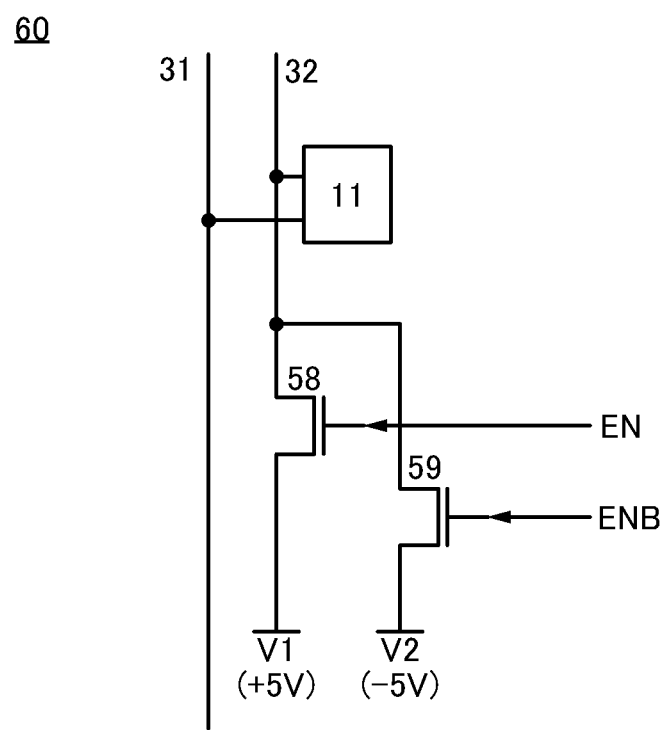
FIG. 15 A diagram illustrating a circuit used in Example 1.

FIG. 15 is a diagram illustrating a structure of a circuit 60 that is a circuit that was subjected to simulation in this example. The circuit 60 had a structure including the pixel 11, a transistor 58, and a transistor 59.

The pixel 11 was connected to the wiring 31 and the wiring 32. The wiring 32 was connected to one of a source and a drain of the transistor 58 and one of a source and a drain of the transistor 59.

As the potential V1, +5V was applied to the other of the source and the drain of the transistor 58. As the potential V2, −5V was applied to the other of the source and the drain of the transistor 59. The signal EN was supplied to a gate of the transistor 58. The signal ENB was supplied to a gate of the transistor 59. Here, the transistor 58 corresponds to the switch 48a or the switch 48b illustrated in FIG. 7(A), and the transistor 59 corresponds to the switch 49a or the switch 49b illustrated in FIG. 7(A).

Figure 16A:
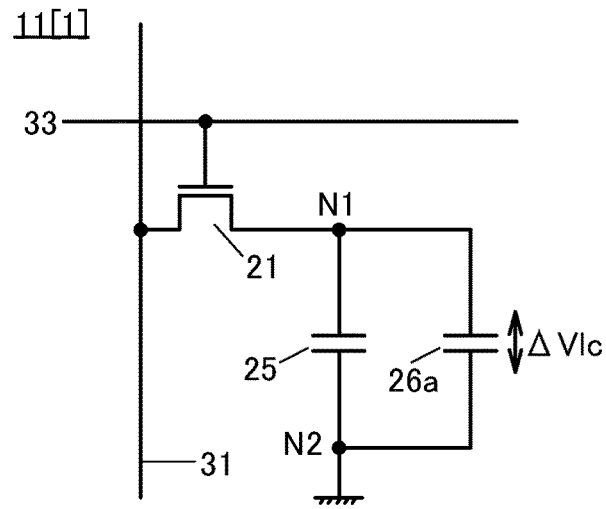
FIGS. 16A to 16C Diagrams illustrating pixels used in Example 1.
Figure 16B:
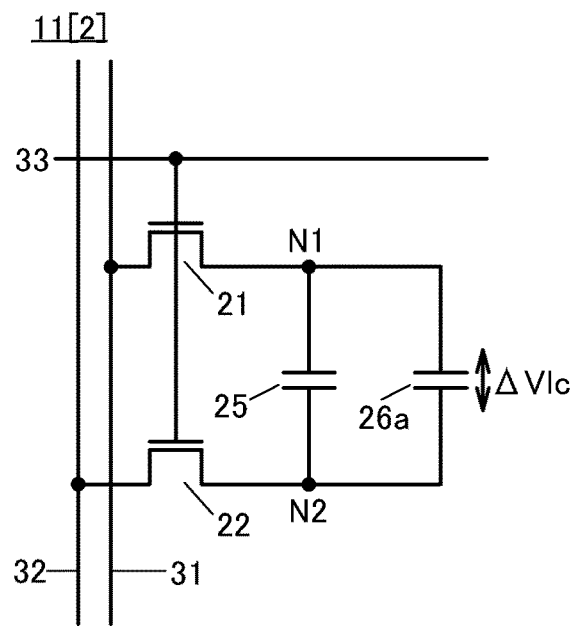
Figure 16C:
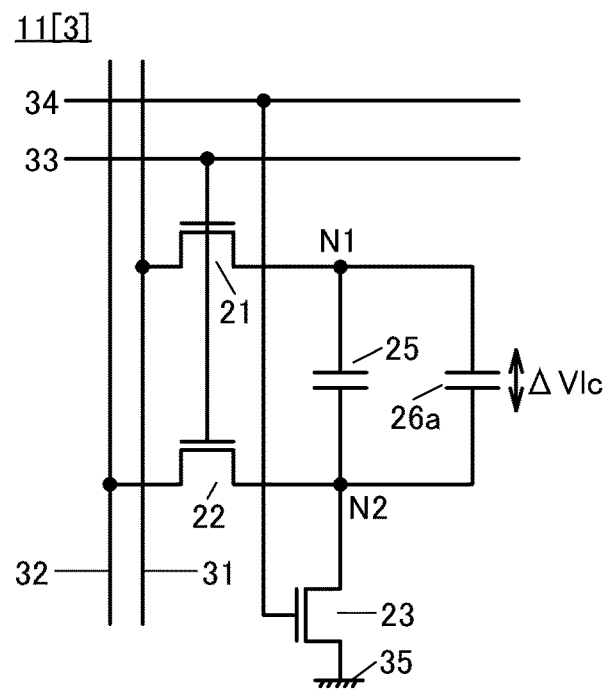

In this example, the structure of the pixel 11 was assumed to be a pixel 11[1] illustrated in FIG. 16(A), a pixel 11[2] illustrated in FIG. 16(B), and a pixel 11[3] illustrated in FIG. 16(C).

The pixel 11[1] had a structure including the transistor 21, the capacitor 25, and a capacitor 26a. The one of the source and the drain of the transistor 21 was connected to the one electrode of the capacitor 25. The one electrode of the capacitor 25 was connected to one electrode of the capacitor 26a. The other of the source and the drain of the transistor 21 was connected to the wiring 31. Each of the potential of the other electrode of the capacitor 25 and the potential of the other electrode of the capacitor 26a was a ground potential.

The pixel 11[2] corresponds to the pixel 11a described in Embodiment 1. The pixel 11[3] corresponds to the pixel 11b described in Embodiment 1. Here, in the pixels 11[1] to 11[3], the capacitor 26a resembling the display element 26 that was a liquid crystal element was used. In addition, in the pixel 11[3], the potential of the wiring 35 was a ground potential.

The transistor 21, the transistor 22, the transistor 23, the transistor 58, and the transistor 59 were OS transistors. The channel lengths of the transistor 21, the transistor 22, and the transistor 23 were 4 μm, the channel widths thereof were 4 μm, the channel lengths of the transistor 58 and the transistor 59 were 4 μm, and the channel widths thereof were 800 μm. Furthermore, the storage capacitance of the capacitor 25 was 200 fF, and the storage capacitance of the capacitor 26a was 100 fF.

Figure 17A:
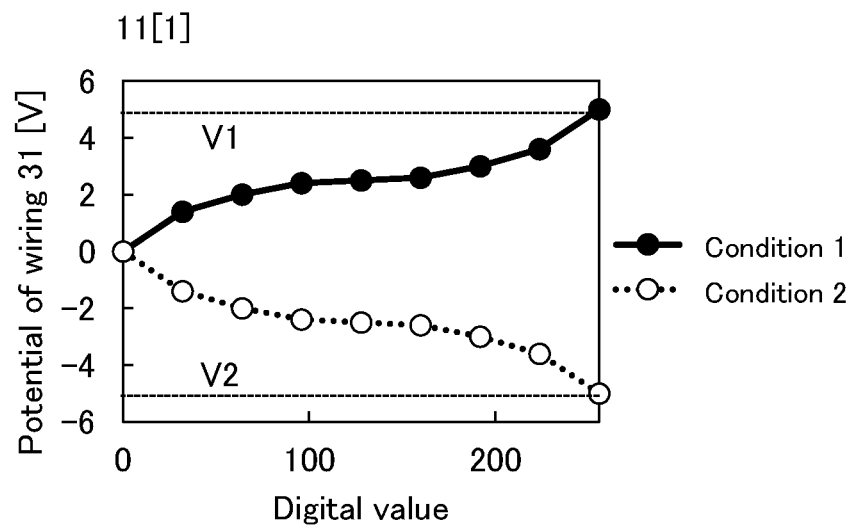
FIGS. 17A and 17B Graphs showing calculation conditions in Example 1.
Figure 17B:
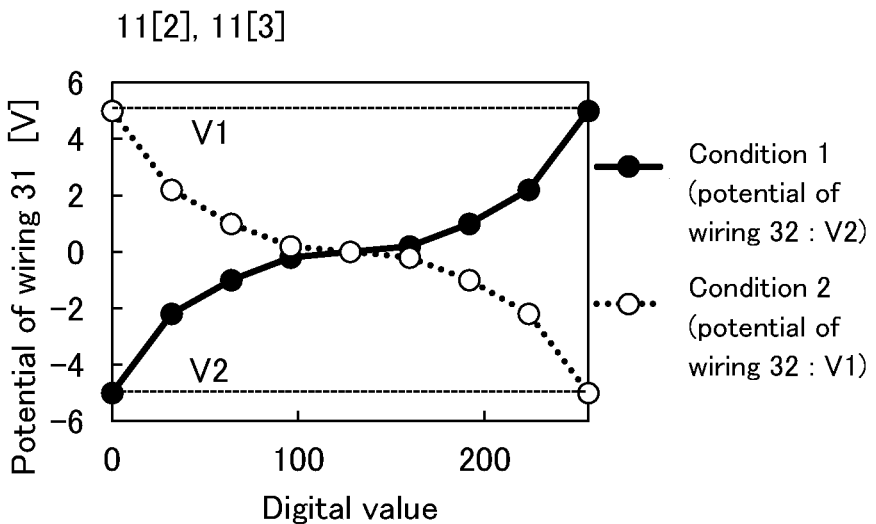

In this example, the potential of the wiring 31 was a potential corresponding to an 8-bit digital signal. FIG. 17(A) is a graph showing the relationship between the potential of the wiring 31 and the digital value of the digital signal in the case where the pixel 11 is the pixel 11[1]. FIG. 17(B) is a graph showing the relationship between the potential of the wiring 31 and the digital value of the digital signal in the case where the pixel 11 is the pixel 11[2] or the pixel 11[3]. Note that in this example, all the digital value are expressed in decimal notation.

In this example, as for the case of each of Condition 1 and Condition 2 when the digital value of the digital signal was "0", "31", "63", "95", "127", "159", "191", "223", or "255", the potential difference ΔVIc between the one electrode of the capacitor 26a and the other electrode of the capacitor 26a was calculated. Here, as shown in FIGS. 17(A) and 17(B), the potential supplied to the wiring 31 under Condition 2 was a potential obtained by inverting the polarity of the potential supplied to the wiring 31 under Condition 1. Specifically, as shown in FIG. 17(A), in the case where the pixel 11 was the pixel 11[1], the potential of the wiring 31 in the case where the digital value of the digital signal was "0" was set to 0 V, and the potential of the wiring 31 in the case where the digital value of the digital signal was "255" was set to the potential V1 under Condition 1 and the potential V2 under Condition 2. Meanwhile, in the case where the pixel 11 was the pixel 11[2] or the pixel 11[3] as shown in FIG. 17(B), under Condition 1, the potential of the wiring 31 in the case where the digital value of the digital signal was "0" was the potential V2, and the potential of the wiring 31 in the case where the digital value of the digital signal was "255" was the potential V1. Under Condition 2, the potential of the wiring 31 in the case where the digital value of the digital signal was "0" was the potential V1, and the potential of the wiring 31 in the case where the digital value of the digital signal was "255" was the potential V2.

Under Condition 1, the transistor 59 was turned on, and the transistor 58 was turned off, whereby the potential of the wiring 32 was set to the potential V2. On the other hand, under Condition 2, the transistor 58 was turned on, and the transistor 59 was turned off, whereby the potential of the wiring 32 was set to the potential V1. Moreover, as described above, the potential supplied to the wiring 31 under Condition 2 was a potential obtained by inverting the polarity of the potential supplied to the wiring 31 under Condition 1. From the above, switching from Condition 1 to Condition 2 corresponds to frame inversion driving.

A method for operating the circuit 60 in this example will be described. In the case where the pixel 11 was the pixel 11[1], first, the potential of the wiring 31 was set to a potential corresponding to the digital value shown in FIG. 17(A). Next, the transistor 21 was turned on, the potential of the wiring 31 was written to the node N1, and then, the transistor 21 was turned off. Then, the potential difference ΔVlc after one frame period (0.6 ms) passed after the transistor 21 was turned off was calculated. The above operation was performed under each of Condition 1 and Condition 2.

In the case where the pixel 11 was the pixel 11[2], first, the potential of the wiring 31 was set to a potential corresponding to the digital value shown in FIG. 17(B). Under Condition 1, the transistor 59 was turned on, and the transistor 58 was turned off, whereby the potential of the wiring 32 was set to the potential V2, and under Condition 2, the transistor 58 was turned on, and the transistor 59 was turned off, whereby the potential of the wiring 32 was set to the potential V1. Next, the transistor 21 was turned on, whereby the potential of the wiring 31 was written to the node N1, and the transistor 22 was turned on, whereby the potential of the wiring 32 was written to the node N2, and after that, the transistor 21 and the transistor 22 were turned off. The potential difference ΔVlc after one frame period passed after the transistor 21 and the transistor 22 were turned off was calculated.

In the case where the pixel 11 was the pixel 11[3], first, the potential of the wiring 31 was set to a potential corresponding to the digital value shown in FIG. 17(B). Under Condition 1, the transistor 59 was turned on, and the transistor 58 was turned off, whereby the potential of the wiring 32 was set to the potential V2, and under Condition 2, the transistor 58 was turned on, and the transistor 59 was turned off, whereby the potential of the wiring 32 was set to the potential V1. Next, the transistor 21 was turned on, whereby the potential of the wiring 31 was written to the node N1, and the transistor 22 was turned on, whereby the potential of the wiring 32 was written to the node N2, and after that, the transistor 21 and the transistor 22 were turned off. After that, the transistor 23 was turned on, whereby the potential of the node N2 was set to the ground potential. The potential difference ΔVlc after one frame period passed after the transistor 21 and the transistor 22 were turned off was calculated.

Figure 18:
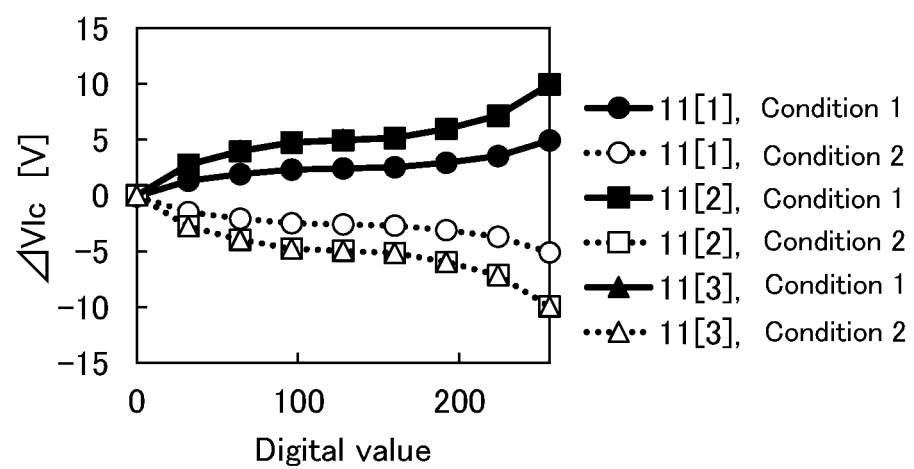
FIG. 18 A graph showing calculation results in Example 1.

FIG. 18 is a graph showing the relationship between the potential differences ΔVlc and the digital values of the digital signal under Condition 1 and Condition 2 in the cases where the pixel 11 was the pixel 11[1], the pixel 11[2], and the pixel 11[3]. As shown in FIG. 18, it was confirmed that in the case where the pixel 11 is the pixel 11[2] or the pixel 11 [3], the voltage applied to the capacitor 26a resembling the liquid crystal element became higher than in the case where the pixel 11 is the pixel 11[1], even when the digital values of the digital signals were the same. It was also confirmed that when the pixel 11 had any of the structures of the pixels 11[1] to 11[3], the voltage applied to the capacitor 26a was able to be retained for one frame period.

REFERENCE NUMERALS

10: display device, 11: pixel, 11a: pixel, 11b: pixel, 11c: pixel, 11d: pixel, 12: gate driver circuit, 13: source driver circuit, 14: pixel array, 15: circuit, 21: transistor, 22: transistor, 23: transistor, 24: transistor, 25: capacitor, 26 display element, 26a: capacitor, 31: wiring, 32: wiring, 33: wiring, 34: wiring, 35: wiring, 41: shift register, 41a: shift register, 41b: shift register, 42: latch circuit, 42a: latch circuit, 42b: latch circuit, 43: level shift circuit, 43a: level shift circuit, 43b: level shift circuit, 44: PTL, 44a: N-PTL, 44b: P-PTL, 45: selection circuit, 46: amplifier circuit, 46a: amplifier circuit, 46b: amplifier circuit, 47: resistor string, 47a: resistor string, 47b: resistor string, 48: switch, 48a: switch, 48b: switch, 49: switch, 49a: switch, 49b: switch, 51: data bus wiring, 57: resistor, 57a: resistor, 57b: resistor, 58: transistor, 59: transistor, 60: circuit, 61: signal generation circuit, 62: converter circuit, 71: power supply line, 72: power supply line, 111: substrate, 113: substrate, 121: overcoat, 125a: polarizing plate, 125b: polarizing plate, 131: coloring layer, 132: light-blocking layer, 141: bonding layer, 162: FPC, 181: electrode, 182: electrode, 183: liquid crystal layer, 211: insulating layer, 212: insulating layer, 215: insulating layer, 217: insulating layer, 220: insulating layer, 221: conductive layer, 222a: conductive layer, 222b: conductive layer, 224: conductive layer, 231: semiconductor layer, 242: connector, 255: conductive layer, 552: backlight unit, 565: conductive layer, 723: electrode, 726: insulating layer, 728: insulating layer, 729: insulating layer, 741: insulating layer, 742: semiconductor layer, 744a: electrode, 744b: electrode, 746: electrode, 771: substrate, 772: insulating layer, 810: transistor, 811: transistor, 820: transistor, 821: transistor, 825: transistor, 826: transistor, 842: transistor, 843: transistor, 844: transistor, 845: transistor, 846: transistor, 847: transistor, 7000: display portion, 7100: television device, 7101: housing, 7103: stand, 7111: remote controller, 7200: laptop personal computer, 7211: housing, 7212: keyboard, 7213: pointing device, 7214: external connection port, 7300: digital signage, 7301: housing, 7303: speaker, 7311: information terminal, 7400: digital signage, 7401: pillar, 7411: information terminal.

The invention claimed is:

1. A display device comprising:
a pixel; and
a source drive circuit,
wherein the pixel comprises a first transistor, a second transistor, a capacitor, and a display element,
wherein one of a source and a drain of the first transistor is electrically connected to one electrode of the capacitor,
wherein the one electrode of the capacitor is electrically connected to one electrode of the display element,
wherein one of a source and a drain of the second transistor is electrically connected to the other electrode of the capacitor,
wherein the other electrode of the capacitor is electrically connected to the other electrode of the display element,
wherein the other of the source and the drain of the first transistor is electrically connected to the source driver circuit through a first wiring,
wherein the other of the source and the drain of the second transistor is electrically connected to the source driver circuit through a second wiring,
wherein the source driver circuit has a function of supplying a first potential or a second potential to the second wiring,
wherein the source driver circuit comprises a first resistor and a second resistor,
wherein the first potential is supplied to one terminal of the first resistor,
wherein the second potential is supplied to one terminal of the second resistor,
wherein the first potential is a positive potential, and
wherein the second potential is a negative potential.

2. The display device according to claim 1,
wherein the source driver circuit comprises a first switch and a second switch,
wherein the one terminal of the first resistor is electrically connected to one terminal of the first switch,
wherein the other terminal of the first switch is electrically connected to the second wiring,
wherein the one terminal of the second resistor is electrically connected to one terminal of the second switch, and
wherein the other terminal of the second switch is electrically connected to the second wiring.

3. The display device according to claim 1,
wherein an absolute value of the first potential and an absolute value of the second potential is the same or substantially the same.

4. The display device according to claim 1,
wherein a gate of the first transistor and a gate of the second transistor is electrically connected to a third wiring.

5. The display device according to claim 4,
wherein the display device comprises a gate driver circuit, and
wherein the third wiring is electrically connected to the gate driver circuit.

6. The display device according to claim 1,
wherein the display element is a liquid crystal element.

7. The display device according to claim 6,
wherein the display element is a liquid crystal element employing a horizontal electric field mode.

8. The display device according to claim 7,
wherein the display element comprises a liquid crystal exhibiting a blue phase.

9. The display device according to claim 1,
wherein each of the first transistor and the second transistor comprises a metal oxide in its channel formation region, and
wherein the metal oxide comprises In, Zn, and M, M being Al, Ti, Ga, Sn, Y, Zr, La, Ce, Nd, or Hf.

10. The display device according to claim 1,
wherein the pixel comprises a third transistor,
wherein one of a source and a drain of the third transistor is electrically connected to the other electrode of the display element, and
wherein the one of the source and the drain of the third transistor is electrically connected to a common wiring.

11. The display device according to claim 10,
wherein the third transistor comprises a metal oxide in its channel formation region, and
wherein the metal oxide comprises In, Zn, and M, M being Al, Ti, Ga, Sn, Y, Zr, La, Ce, Nd, or Hf.

12. A display device comprising:
a pixel; and
a source drive circuit,
wherein the pixel comprises a first transistor, a second transistor, a third transistor, a capacitor, and a display element,
wherein one of a source and a drain of the first transistor is electrically connected to one electrode of the capacitor,
wherein the one electrode of the capacitor is electrically connected to one electrode of the display element,
wherein one of a source and a drain of the second transistor is electrically connected to the other electrode of the capacitor,
wherein the other electrode of the capacitor is electrically connected to the other electrode of the display element,
wherein the other of the source and the drain of the first transistor is electrically connected to the source driver circuit through a first wiring,
wherein the other of the source and the drain of the second transistor is electrically connected to the source driver circuit through a second wiring,
wherein one of a source and a drain of the third transistor is electrically connected to the other electrode of the display element, and
wherein the other of the source and the drain of the third transistor is electrically connected to a common wiring.

13. The display device according to claim 12,
wherein the source driver circuit has a function of supplying a first potential or a second potential to the second wiring,
wherein the source driver circuit comprises a first resistor and a second resistor,
wherein the first potential is supplied to one terminal of the first resistor, and
wherein the second potential is supplied to one terminal of the second resistor.

14. The display device according to claim 13,
wherein the source driver circuit comprises a first switch and a second switch,
wherein the one terminal of the first resistor is electrically connected to one terminal of the first switch,
wherein the other terminal of the first switch is electrically connected to the second wiring,
wherein the one terminal of the second resistor is electrically connected to one terminal of the second switch, and
wherein the other terminal of the second switch is electrically connected to the second wiring.

15. The display device according to claim 13,
wherein the first potential is a positive potential, and
wherein the second potential is a negative potential.

16. The display device according to claim 15,
wherein an absolute value of the first potential and an absolute value of the second potential is the same or substantially the same.

17. The display device according to claim 12,
wherein a gate of the first transistor and a gate of the second transistor is electrically connected to a third wiring.

18. The display device according to claim 17,
wherein the display device comprises a gate driver circuit, and
wherein the third wiring is electrically connected to the gate driver circuit.

19. The display device according to claim 12,
wherein the display element is a liquid crystal element.

20. The display device according to claim 12,
wherein each of the first transistor, the second transistor and the third transistor comprises a metal oxide in its channel formation region, and
wherein the metal oxide comprises In, Zn, and M, M being Al, Ti, Ga, Sn, Y, Zr, La, Ce, Nd, or Hf.

* * * * *